(12) United States Patent
Kim et al.

(10) Patent No.: US 11,990,526 B2
(45) Date of Patent: May 21, 2024

(54) SEMICONDUCTOR DEVICE AND METHOD OF MANUFACTURING SAME

(71) Applicant: SAMSUNG ELECTRONICS CO., LTD., Suwon-si (KR)

(72) Inventors: Young Mok Kim, Yongin-si (KR); Yong Sang Jeong, Hwaseong-si (KR); Kyung Lyong Kang, Hwaseong-si (KR); Jun Gu Kang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 17/735,155

(22) Filed: May 3, 2022

(65) Prior Publication Data
US 2023/0084408 A1 Mar. 16, 2023

(30) Foreign Application Priority Data
Sep. 16, 2021 (KR) .................. 10-2021-0123720

(51) Int. Cl.
H01L 29/78 (2006.01)
H01L 27/088 (2006.01)
H01L 29/423 (2006.01)

(52) U.S. Cl.
CPC ........ H01L 29/4236 (2013.01); H01L 27/088 (2013.01); H01L 29/78 (2013.01)

(58) Field of Classification Search
CPC .... H01L 29/4236; H01L 29/78; H01L 27/088
USPC .................................................. 257/288
See application file for complete search history.

(56) References Cited

U.S. PATENT DOCUMENTS

| 7,476,923 | B2* | 1/2009 | Huang ............... H10B 12/0385 257/532 |
| 7,750,399 | B2* | 7/2010 | Choi .................... H01L 29/1054 257/341 |
| 8,101,482 | B2 | 1/2012 | Kim |
| 8,299,517 | B2* | 10/2012 | Jang ...................... H10B 12/053 257/302 |
| 8,476,700 | B2 | 7/2013 | Kim et al. |
| 9,184,053 | B2 | 11/2015 | Shinohara et al. |
| 10,276,710 | B1 | 4/2019 | Li et al. |
| 10,319,827 | B2 | 6/2019 | Smith et al. |
| 10,903,334 | B2 | 1/2021 | Hsiao et al. |
| 10,985,256 | B2 | 4/2021 | Kung et al. |
| 11,004,844 | B2 | 5/2021 | Chen et al. |
| 2021/0036108 | A1 | 2/2021 | Singh et al. |
| 2021/0074843 | A1 | 3/2021 | Li |

* cited by examiner

Primary Examiner — Monica D Harrison
(74) Attorney, Agent, or Firm — Fish & Richardson P.C.

(57) ABSTRACT

A semiconductor device includes; an active region extending in a first horizontal direction on a substrate, source/drain regions disposed on the active region, a buried trench formed between the source/drain regions, a buried insulating layer surrounding both side walls of the buried trench in the first horizontal direction between the source/drain regions, a wing trench formed in a lower part of the buried trench and having a width greater than a width of the buried trench, and a gate electrode extending in a second horizontal direction on the active region, and disposed within each of the buried trench and the wing trench.

20 Claims, 30 Drawing Sheets

SEMICONDUCTOR DEVICE AND METHOD OF MANUFACTURING SAME

CROSS-REFERENCE TO RELATED APPLICATION

This application claims priority under 35 U.S.C. 119 from Korean Patent Application No. 10-2021-0123720 filed on Sep. 16, 2021 in the Korean Intellectual Property Office, the subject matter of which is hereby incorporated by reference in its entirety.

BACKGROUND

1. Technical Field

The inventive concept relates to semiconductor devices.

2. Description of the Related Art

Although decreased voltage levels are common with miniaturization of semiconductor elements, there are certain applications (e.g., vehicle applications) wherein a booster circuit providing a higher voltage (e.g., 12V) may be required. Such a booster circuit may be provided as a stand alone circuit, or as part of a more general power supply circuit. Accordingly, it may be necessary to provide high voltage transistor(s) together with low voltage transistor(s) within a semiconductor device.

SUMMARY

According to embodiments of the inventive concept, after a deep trench—a deep trench defining an active region on a substrate—is formed, a buried trench extending vertically into the active region may be formed. A wing trench having a width greater than that of the buried trench may then be formed through a lower part of the buried trench. This approach provides improved structural stability for the constituent semiconductor device during process(es) forming the buried trench and/or the wing trench. Further, a semiconductor device manufactured using this approach may provide a structure characterized by a wing trench width—associated with a wing trench formed in the lower part of the buried trench—that is greater than a buried trench width.

According to embodiments of the inventive concept, a semiconductor device may include; an active region extending in a first horizontal direction on a substrate, source/drain regions disposed on the active region, a buried trench formed between the source/drain regions, a buried insulating layer surrounding both side walls of the buried trench in the first horizontal direction between the source/drain regions, a wing trench formed in a lower part of the buried trench and having a width greater than a width of the buried trench, and a gate electrode extending in a second horizontal direction on the active region, and disposed within each of the buried trench and the wing trench.

According to embodiments of the inventive concept, a semiconductor device may include; a substrate including a first region and a second region, a first active region extending in a first horizontal direction on the first region, an active pattern protruding from the first active region in a vertical direction and extending in the first horizontal direction, a second active region extending in the first horizontal direction on the second region, first source/drain regions disposed on the active pattern, second source/drain regions disposed on the second active region, a buried trench formed between the second source/drain regions, a wing trench formed in a lower part of the buried trench and having a width greater than a width of the buried trench, a first gate electrode extending in a second horizontal direction on the active pattern, and a second gate electrode extending in the second horizontal direction on the second active region and disposed within each of the buried trench and the wing trench.

According to embodiments of the inventive concept, a semiconductor device may include; a substrate including a first region, a second region and a third region, a first active region extending in a first horizontal direction on the first region, an active pattern protruding from the first active region in a vertical direction and extending in the first horizontal direction, a second active region extending in the first horizontal direction on the second region, a third active region extending in the first horizontal direction on the third region, first source/drain regions disposed on the active pattern, second source/drain regions disposed on the second active region, third source/drain regions disposed on the third active region, a first buried trench formed between the second source/drain regions, a second buried trench formed between the third source/drain regions, a first buried insulating layer surrounding both side walls of the first buried trench in the first horizontal direction between the second source/drain regions, a second buried insulating layer surrounding both side walls of the second buried trench in the first horizontal direction between the third source/drain regions, a first wing trench formed in a lower part of the first buried trench and having a width greater than a width of the first buried trench, a second wing trench formed in a lower part of the second buried trench and having a width greater than a width of the second buried trench, a first gate electrode extending in a second horizontal direction on the active pattern, a second gate electrode extending in the second horizontal direction on the second active region and disposed within each of the first buried trench and the first wing trench, and a third gate electrode extending in the second horizontal direction on the third active region and disposed within each of the second buried trench and the second wing trench.

It should be noted here, that various advantages, features and aspects of the inventive concept are not restricted to only those specifically set forth above. Indeed, the above and other aspects of the inventive concept will become more apparent to those skilled in the art upon consideration of the illustrated embodiments presented herein.

BRIEF DESCRIPTION OF THE DRAWINGS

The making and use of the inventive concept will become more apparent to those skilled in the art upon consideration of the following detail description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Although certain semiconductor devices illustrated hereafter are fin-type transistors (FinFET) (e.g., transistors including a channel region having a fin-type pattern or shape) as working examples, the inventive concept is not limited thereto. For example, in some embodiments, the semiconductor device may include a MBCFET™ (Multi-Bridge Channel Field Effect Transistor) including nanosheets.

Hereinafter, an exemplary semiconductor device according to embodiments of the inventive concept will now be described in relation to FIGS. 1 and 2.

Figure 1:
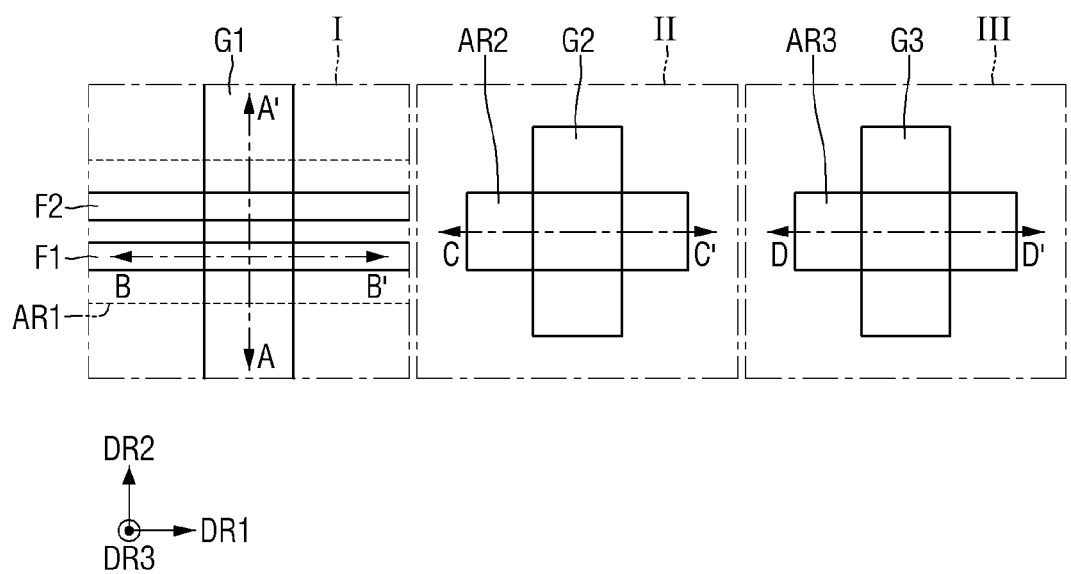
FIG. 1 is a plan (or top-down) view illustrating a semiconductor device according to embodiments of the inventive concept.
Figure 2:
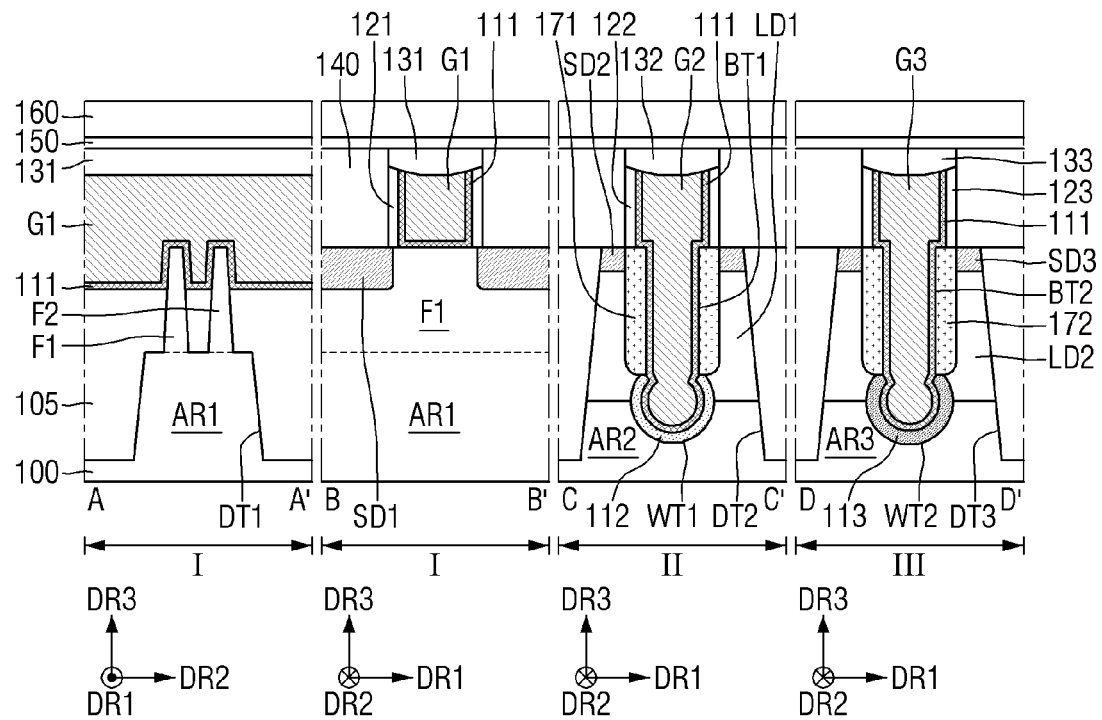
FIG. 2 is a cross-sectional view illustrating cross-sections respectively taken along line A-A', line B-B', line C-C' and line D-D' of FIG. 1.

FIG. (FIG. 1) is a layout diagram illustrating the semiconductor device, and FIG. 2 is a cross-sectional view illustrating various cross-sections respectively taken along line A-A', line B-B', line C-C' and line D-D' of FIG. 1.

Referring to FIGS. 1 and 2, the semiconductor device generally includes a substrate 100, a field insulating layer 105, first, second and third (hereafter collectively, "first to third") gate electrodes G1, G2 and G3, first to third gate insulating layers, first to third gate spacers 121, 122 and 123, first to third capping patterns 131, 132 and 133, first to third source/drain regions SD1, SD2 and SD3, first and second low doping regions LD1 and LD2, a first interlayer insulating layer 140, an etching stop layer 150, a second interlayer insulating layer 160, and first and second buried insulating layers 171 and 172.

The substrate 100 may be a silicon substrate or a silicon-on-insulator (SOI) substrate. In some embodiments, the substrate 100 may include at least one of, for example, silicon germanium, silicon germanium on insulator (SGOI), indium antimonide, lead tellurium compounds, indium arsenic, indium phosphide, gallium arsenide, and gallium antimonide.

First to third regions I, II and III may be defined on the substrate 100. For example, a low voltage transistor may be disposed on the substrate 100 in the first region I, an intermediate voltage transistor may be disposed on the substrate 100 in the second region II, and a high voltage transistor may be disposed on the substrate 100 in the third region III.

Each of the first to third active regions AR1, AR2, and AR3 may extend in a first horizontal direction DR1 and a second horizontal direction DR2 intersecting the first horizontal direction DR1 on the substrate 100. Collectively, the first to third active regions AR1, AR2, and AR3 may arranged in the first direction DR1 on the substrate 100. Each of the first to third active regions AR1, AR2, and AR3 may include materials layer(s), element(s) and/or component(s) that protrude upward from the substrate 100 in a vertical direction DR3. Each of the first to third active regions AR1, AR2, and AR3 may be part of the substrate 100, and may in some embodiments may include epitaxial layer(s) grown from the substrate 100.

In the illustrated example of FIGS. 1 and 2, the first active region AR1 may be disposed in the first region I, the second active region AR2 may be disposed in the second region II, and the third active region AR3 may be disposed in the third region III. Further in this regard, the first active region AR1 may be defined by a first deep trench DT1 formed on the first region I, the second active region AR2 may be defined by a second deep trench DT2 formed on the second region II, and the third active region AR3 may be defined by a third deep trench DT3 formed on the third region III.

In some embodiments, an upper surface of the second active region AR2 and an upper surface of the third active region AR3 may be formed at a level lower than an upper surface of the first active pattern F1, but inventive concept is not limited thereto. In this particular context, the term "level" denotes a location or disposition (e.g., measured in the vertical direction) of an element, component, region and/or feature in relation to an arbitrarily selected horizontal surface (e.g., an upper surface of the substrate 100).

Each of the first and second active patterns F1 and F2 may extend in the first horizontal direction DR1 on the first active region AR1. Each of the first and second active patterns F1 and F2 may protrude from the first active region AR1 in the vertical direction DR3. The second active pattern F2 may be spaced apart from the first active pattern F1 in a second horizontal direction DR2.

The field insulating layer 105 may be disposed on the substrate 100. The field insulating layer 105 may substantially surround side walls of each of the first to third active regions AR1, AR2, and AR3. That is, the field insulating layer 105 may substantially surround side walls of each of the first and second active patterns F1 and F2. Each of the first and second active patterns F1 and F2 may protrude from the upper surface of the field insulating layer 105 in the vertical direction DR3. The field insulating layer 105 may include at least one of, for example, an oxide film, a nitride film, and an oxynitride film.

A first low doping region LD1 may be disposed on the second active region AR2. The first low doping region LD1 may be doped with impurities having a concentration lower than that of a second source/drain region SD2.

A second low doping region LD2 may be disposed on the third active region AR3. The second low doping region LD2 may be doped with impurities having a concentration lower than that of a third source/drain region SD3.

A first source/drain region SD1 may be disposed on at least one side of the first gate electrode G1. The first source/drain region SD1 may be disposed on each of the first and second active patterns F1 and F2. The second source/drain region SD2 may be disposed on at least one side of a second gate electrode G2. The second source/drain region SD2 may be disposed on the first low doping region LD1. The third source/drain region SD3 may be disposed on at least one side of a third gate electrode G3. The third source/drain region SD3 may be disposed on the second low doping region LD2.

As shown in FIG. 2, upper surfaces of the first to third source/drain regions SD1, SD2, and SD3 may be formed on the same horizontal plane (or at the same level), but the inventive concept is not limited thereto. For example, in some embodiments, one or more of the upper surfaces the first to third source/drain regions SD1, SD2 and SD3 may be formed at a level different from another one or more of the upper surfaces of the first to third source/drain regions SD1, SD2 and SD3.

Further, a third "thickness" of the third source/drain region SD3 (e.g., a dimension measured in the vertical direction DR3) may be equal to a second thickness of the second source/drain region SD2, but the inventive concept is not limited thereto. For example, in some embodiments, the third thickness of the third source/drain region SD3 may be greater than a second thickness of the second source/drain region SD2.

A first buried insulating layer 171 may be formed between the second source/drain regions SD2. Thus, the second source/drain regions SD2 may be separated in the first horizontal direction DR1 by the first buried insulating layer 171. Further, the first buried insulating layer 171 may be formed between the first low doping regions LD1. Thus, the first low doping regions LD1 may be separated in the first horizontal direction DR1 by the first buried insulating layer 171. At least a portion of side walls of the first buried insulating layer 171 may be substantially surrounded in the first horizontal direction DR1 by the first low doping region LD1.

In some embodiments, the upper surface of the first buried insulating layer 171 may be formed at the same level as the upper surface of the second source/drain region SD2, but the inventive concept is not limited thereto. The lower surface of the first buried insulating layer 171 may be formed at a level higher than that of the upper surface of the second active region AR2.

The second buried insulating layer 172 may be formed between the third source/drain regions SD3. Thus, the third source/drain regions SD3 may be separated in the first horizontal direction DR1 by the second buried insulating layer 172. The second buried insulating layer 172 may be formed between the second low doping regions LD2. Thus, the second low doping regions LD2 may be separated in the first horizontal direction DR1 by the second buried insulating layer 172. Both side walls of the second buried insulating layer 172 in the first horizontal direction DR1 may be substantially surrounded by the second low doping region LD2.

In some embodiments, the upper surface of the second buried insulating layer 172 may be formed at the same level as the upper surface of the third source/drain region SD3, but the inventive concept is not limited thereto. A lower surface of the second buried insulating layer 172 may be formed at a higher level than the upper surface of the third active region AR3.

Each of the first and second buried insulating layers 171 and 172 may include, for example, a silicon oxide ($SiO_2$), but the inventive concept is not limited thereto. For example, in some embodiments, each of the first and second buried insulating layers 171 and 172 may include at least one of, for example, an oxide film, a nitride film, and oxynitride film.

A first buried trench BT1 may be defined as a trench extending from the upper surface of the first buried insulating layer 171 to the lower surface of the first buried insulating layer 171. The first buried trench BT1 may be formed between the second source/drain regions SD2. The first buried trench BT1 may be formed between the first buried insulating layers 171. The first buried insulating layer 171 may be separated in the first horizontal direction DR1 by the first buried trench BT1.

A second buried trench BT2 may be defined as a trench extending from the upper surface of the second buried insulating layer 172 to the lower surface of the second buried insulating layer 172. The second buried trench BT2 may be formed between the third source/drain regions SD3. The second buried trench BT2 may be formed between the second buried insulating layers 172. The second buried insulating layer 172 may be separated in the first horizontal direction DR1 by the second buried trench BT2.

A first wing trench WT1 may be formed in the lower part the first buried trench BT1. The first wing trench WT1 may be defined as a trench extending from the lower part of the first buried trench BT1 into the second active region AR2. The side walls of the first wing trench WT1 may extend laterally from the side walls of the first buried trench BT1 in the first horizontal direction DR1.

For example, a width of the first wing trench WT1 (e.g., a dimension measured in the first horizontal direction DR1) may be greater than a width of the first buried trench BT1. For example, the width of the first wing trench WT1 may be less than a width between both outer walls of the first buried insulating layer 171. In this regard, "both outer walls of the first buried insulating layer 171" may be understood as side walls of the first buried insulating layer 171 contacting the first low doping region LD1.

Side walls of the first wing trench WT1 in the first horizontal direction DR1 may overlap a boundary between the second active region AR2 and the first low doping region LD1. That is, side walls of the first wing trench WT1 in the first horizontal direction DR1 may be substantially surrounded by the second active region AR2 and the first low doping region LD1.

A second wing trench WT2 may be formed in the lower part of the second buried trench BT2. The second wing trench WT2 may be defined as a trench extending from the lower part of the second buried trench BT2 into the third active region AR3. The side walls of the second wing trench WT2 may extend laterally from the side walls of the second buried trench BT2 in the first horizontal direction DR1.

For example, a width of the second wing trench WT2 may be greater than a width of the second buried trench BT2 in the first horizontal direction DR1. For example, the width of the second wing trench WT2 may be greater than the width of the first wing trench WT1. Further, the width of the second wing trench WT2 may be less than a width between both outer walls of the second buried insulating layer 172. In this regard, the term "both outer walls of the second buried insulating layer 172" may be understood as both side walls of the second buried insulating layer 172 contacting the second low doping region LD2.

The side walls of the second wing trench WT2 in the first horizontal direction DR1 may overlap a boundary between the third active region AR3 and the second low doping region LD2. That is, the side walls of the second wing trench WT2 in the first horizontal direction DR1 may be substantially surrounded by the third active region AR3 and the second low doping region LD2.

The first gate electrode G1 may extend in the second horizontal direction DR2 on the first active region AR1. The first gate electrode G1 may be disposed on the first and second active patterns F1 and F2.

The second gate electrode G2 may extend in the second horizontal direction DR2 on the second active region AR2. The second gate electrode G2 may be disposed within each of the first wing trench WT1 and the first buried trench BT1. Further, the second gate electrode G2 may be disposed between the second gate spacers 122 on the first buried insulating layer 171.

For example, the width of the second gate electrode G2 disposed between the second gate spacers 122 may be greater than the width of the second gate electrode G2 disposed within the first buried trench BT1.

The third gate electrode G3 may extend in the second horizontal direction DR2 on the third active region AR3. The third gate electrode G3 may be disposed within each of the second wing trench WT2 and the second buried trench BT2. Further, the third gate electrode G3 may be disposed between the third gate spacers 123 on the second buried insulating layer 172.

For example, the width of the third gate electrode G3 disposed between the third gate spacers 123 may be greater than the width of the third gate electrode G3 disposed within the second buried trench BT2.

Each of the first to third gate electrodes G1, G2, and G3 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), and vanadium (V). Each of the first to third gate electrodes G1, G2, and G3 may include at least one of, for example, a conductive metal oxide and a conductive metal oxynitride, and may further include an oxidized form of one or more of the above-mentioned material(s).

A first gate spacer 121 may extend in the second horizontal direction DR2 along both side walls of the first gate electrode G1. A second gate spacer 122 may extend in the second horizontal direction DR2 along both side walls of the second gate electrode G2 on the first buried insulating layer 171. A third gate spacer 123 may extend in the second horizontal direction DR2 along both side walls of the third gate electrode G3 on the second buried insulating layer 172.

Each of the first to third gate spacers 121, 122 and 123 may include at least one of, for example, silicon nitride (SiN), silicon oxynitride (SiON), silicon oxide (SiO$_2$), silicon oxycarbonitride (SiOCN), silicon boron nitride (SiBN), silicon oxyboronitride (SiOBN), and silicon oxycarbide (SiOC)

A first gate insulating layer 111 may be disposed between the first gate spacers 121. The first gate insulating layer 111 may include a first insulating layer 111. In some embodiments, the first gate insulating layer 111 may include a single film including the first insulating layer 111.

The first insulating layer 111 may be disposed along side walls and a bottom surface of the first gate electrode G1. For example, the first insulating layer 111 may be disposed between the first active pattern F1 and the first gate electrode G1. The first insulating layer 111 may be disposed between the field insulating layer 105 and the first gate electrode G1. The first insulating layer 111 may be disposed between the first gate spacer 121 and the first gate electrode G1.

The second gate insulating layers 111 and 112 may be disposed along the side walls and the bottom surface of the second gate electrode G2. The second gate insulating layers 111 and 112 may include a second insulating layer 112, and the first insulating layer 111 disposed on the second insulating layer 112. The second insulating layer 112 may be disposed along the side walls and the bottom surface of the first wing trench WT1. For example, the second insulating layer 112 contact each of the second active region AR2 and the first low doping region LD1 within the first wing trench WT1.

The first insulating layer 111 may be disposed on the second insulating layer 112 within the first wing trench WT1. The first insulating layer 111 may vertically extend along side walls of the first buried trench BT1. The first insulating layer 111 may contact the first buried insulating layer 171 within the first buried trench BT1. The first insulating layer 111 may be disposed between the second gate spacer 122 and the second gate electrode G2 on the first buried insulating layer 171.

The third gate insulating layers 111 and 113 may be disposed along the side walls and the bottom surface of the third gate electrode G3. The third gate insulating layers 111 and 113 may include a third insulating layer 113, and the first insulating layer 111 disposed on the third insulating layer 113. The third insulating layer 113 may be disposed along the side walls and the bottom surface of the second wing trench WT2. For example, the third insulating layer 113 may contact each of the third active region AR3 and the second low doping region LD2 within the second wing trench WT2.

The first insulating layer 111 may be disposed on the third insulating layer 113 within the second wing trench WT2. The first insulating layer 111 may extend in the vertical direction DR3 along the side walls of the second buried trench BT2. The first insulating layer 111 may contact the second buried insulating layer 172 within the second buried trench BT2. The first insulating layer 111 may be disposed between the third gate spacer 123 and the third gate electrode G3 on the second buried insulating layer 172. For example, the thickness of the third insulating layer 113 may be greater than the thickness of the second insulating layer 112.

The first insulating layer 111 may include at least one of, for example, silicon oxide (SiO$_2$), silicon oxynitride (SiON), silicon nitride (SiN) and a high dielectric material having a dielectric constant greater than that of silicon oxide (SiO$_2$). The high dielectric material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

Each of the second insulating layer 112 and the third insulating layer 113 may include, for example, silicon oxide (SiO$_2$). In some embodiments, each of the second insulating layer 112 and the third insulating layer 113 may include at least one of silicon oxynitride (SiON), silicon nitride (SiN), and a high dielectric material having a higher dielectric constant than silicon oxide (SiO$_2$).

A first capping pattern 131 may be disposed on the first gate electrode G1, the first insulating layer 111, and the first gate spacer 121. A first capping pattern 131 may extend in the second horizontal direction DR2. The second capping pattern 132 may be disposed on the second gate electrode G2, the first insulating layer 111, and the second gate spacer 122. The second capping pattern 132 may extend in the second horizontal direction DR2. A third capping pattern 133 may be disposed on the third gate electrode G3, the first insulating layer 111, and the third gate spacer 123. The third capping pattern 133 may extend in the second horizontal direction DR2.

Each of the first to third capping patterns 131, 132 and 133 may include at least one of, for example, silicon nitride (SiN), silicon oxynitride (SiON), silicon oxide ($SiO_2$), silicon carbonitride (SiCN), and silicon oxycarbonitride (SiOCN).

The first interlayer insulating layer 140 may be disposed on the field insulating layer 105. The first interlayer insulating layer 140 may be disposed to cover each of the first to third source/drain regions SD1, SD2 and SD3, and the first to third gate spacers 121, 122 and 123. For example, the upper surface of the first interlayer insulating layer 140 may be formed at the same level as the upper surfaces of the first to third capping patterns 131, 132 and 133.

The first interlayer insulating layer 140 may include at least one of, for example, silicon oxide, silicon nitride, silicon oxycarbide, silicon oxynitride, silicon oxycarbonitride, and a low dielectric material. here, the low dielectric material may include at least one of, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, and mesoporous silica.

The etching stop layer 150 may be disposed on the first interlayer insulating layer 140 and each of the first to third capping patterns 131, 132 and 133. Although the illustrated example of FIG. 2 assumes that the etching stop layer 150 is formed of a single film, the inventive concept is not limited thereto. In some embodiments, for example, the etching stop layer 150 may be formed of multiple films. In this regard, the etching stop layer 150 may include at least one of, for example, silicon oxide, silicon nitride, silicon oxynitride, and a low dielectric material.

The second interlayer insulating layer 160 may be disposed on the etching stop layer 150, and may include at least one of, for example, silicon oxide, silicon nitride, silicon oxynitride, and a low dielectric material.

Within the context of the exemplary semiconductor device described in relation to FIGS. 1 and 2, a method of manufacturing semiconductor devices according to embodiments of the inventive concept will be described in relation to FIGS. 3 to 18.

Figure 3:
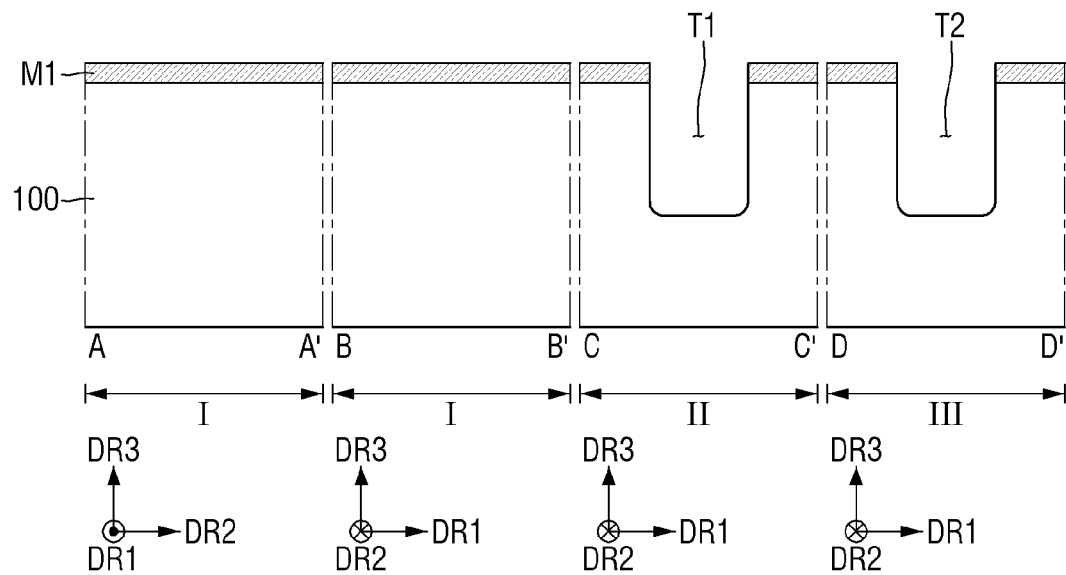
FIGS. 3, 4, 5, 6, 7, 8, 9, 10, 11, 12, 13, 14, 15, 16, 17 and 18 (hereafter collectively, "FIGS. 3 to 18") are related cross-sectional view illustrating a method of manufacture for semiconductor devices according to embodiments of the inventive concept.

Referring to FIG. 3, the substrate 100 including first to third regions I, II and III may be provided. Subsequently, a first mask pattern M1 may be formed on the upper surface of the substrate 100. Subsequently, a first trench TR1 may be formed, by etching the upper surface of the substrate 100 of the second region II, using the first mask pattern M1 as a mask. Further, a second trench TR2 may be formed, by etching the upper surface of the substrate 100 of the third region III, using the first mask pattern M1 as a mask. For example, the first trench TR1 and the second trench TR2 may be formed at the same depth. That is, a lower surface of the first trench TR1 and a lower surface of the second trench TR2 may be formed at the same level.

Figure 4:
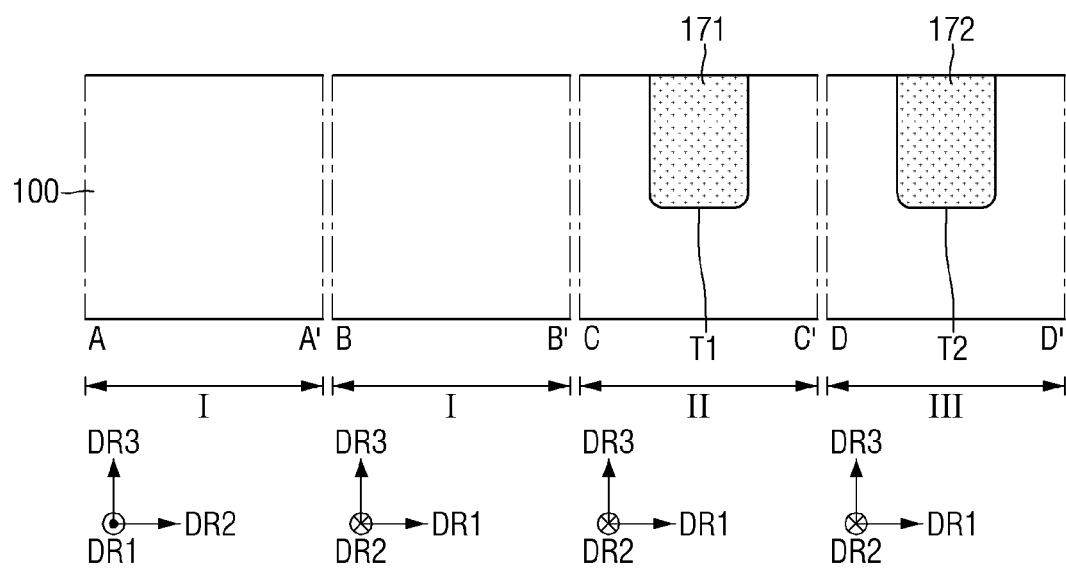

Referring to FIG. 4, the first buried insulating layer 171 may be formed within the first trench T1. Further, the second buried insulating layer 172 may be formed within the second trench T2. Each of the first and second buried insulating layers 171 and 172 may include, for example, a silicon oxide ($SiO_2$). The first mask pattern M1 may then be removed through the flattening process. As a result, each of the upper surface of the substrate 100, the upper surface of the first buried insulating layer 171 and the upper surface of the second buried insulating layer 172 may be formed on the same level.

Figure 5:
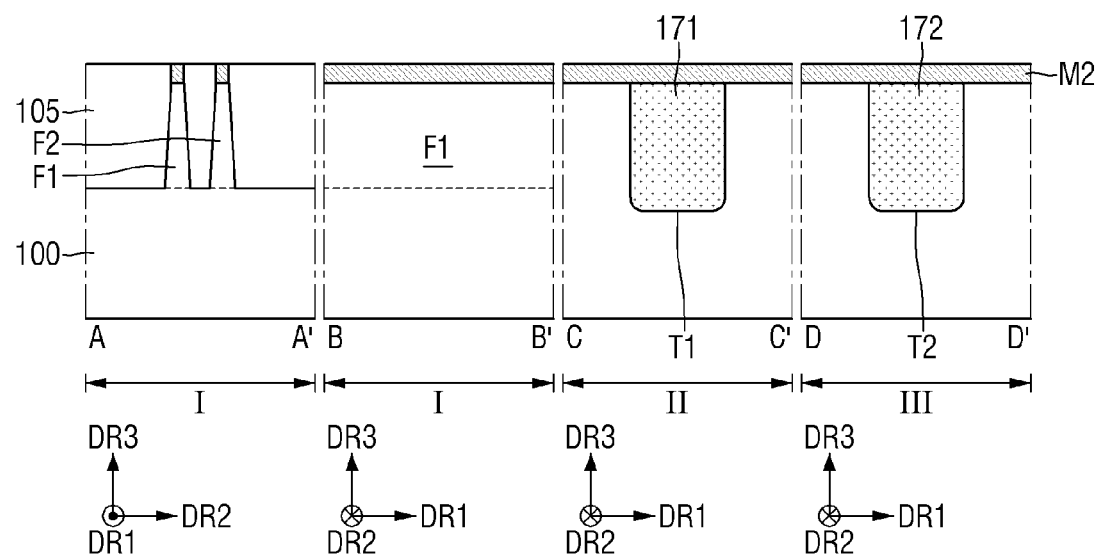

Referring to FIG. 5, a second mask pattern M2 may be formed on each of the upper surface of the substrate 100, the upper surface of the first buried insulating layer 171 and the upper surface of the second buried insulating layer 172. Subsequently, by etching part of the substrate 100 of the first region I using the second mask pattern M2 as a mask, the first and second active patterns F1 and F2 extending in the first horizontal direction DR1 may be formed.

Subsequently, the field insulating layer 105 may be formed to surround the side walls of each of the first and second active patterns F1 and F2 and the side walls of the second mask pattern M2. For example, the upper surface of the field insulating layer 105 may be formed on the same level as the upper surface of the second mask pattern M2.

Figure 6:
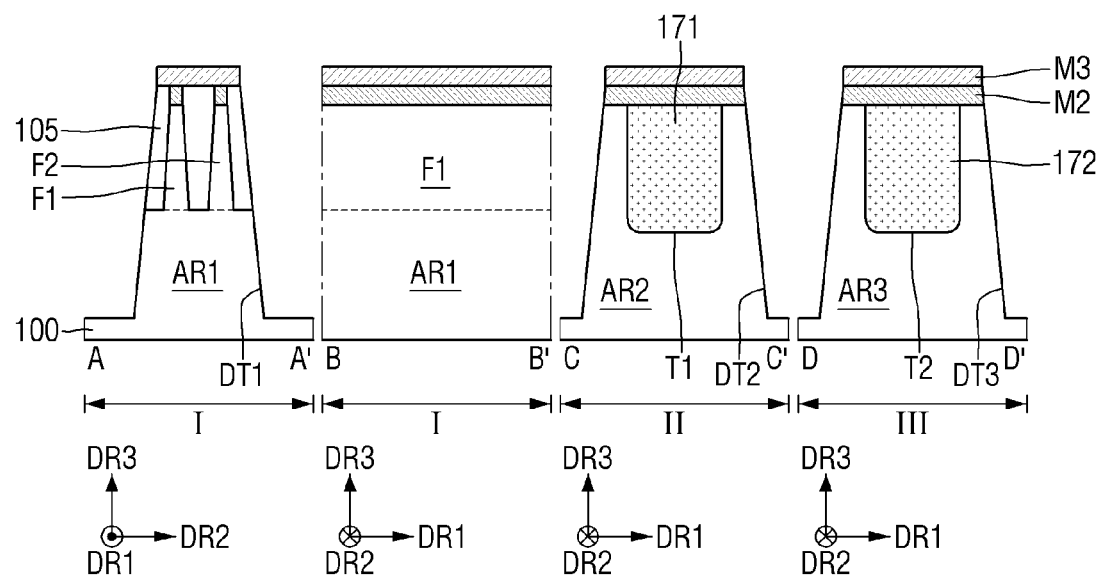

Referring to FIG. 6, a third mask pattern M3 may be formed on the field insulating layer 105 and the second mask pattern M2. Subsequently, part of the second mask pattern M2, part of the field insulating layer 105, and part of the substrate 100 may be etched, using the third mask pattern M3 as a mask. Through such an etching process, a first deep trench DT1 may be formed on the substrate 100 of the first region I, a second deep trench DT2 may be formed on the substrate 100 of the second region II, and a third deep trench DT3 may be formed on the substrate 100 of the third region III.

As a result, the first active region AR1 defined by the first deep trench DT1 may be formed on the substrate 100 of the first region I, the second active region AR2 defined by the second deep trench DT2 may be formed on the substrate 100 of the second region II, and the third active region AR3 defined by the third deep trench DT3 may be formed on the substrate 100 of the third region III. Each of the first to third active regions AR1, AR2, and AR3 may extend in the first horizontal direction DR1.

Figure 7:
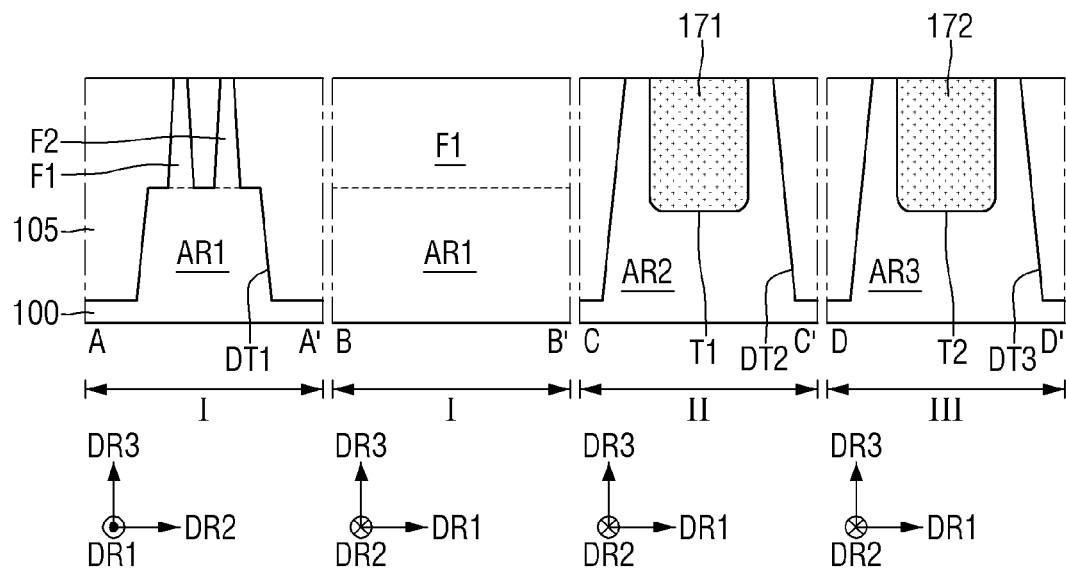

Referring to FIG. 7, the field insulating layer 105 may be further formed within each of the first to third deep trenches DT1, DR2, and DR3. Subsequently, the third mask pattern M3 and the second mask pattern M2 may be removed through the flattening process. As a result, the upper surfaces of each of the first and second active patterns F1 and F2, the upper surface of the field insulating layer 105, the upper surface of the first buried insulating material layer 171, and the upper surface of the second buried insulating layer 172 may each be formed at the same level.

Figure 8:
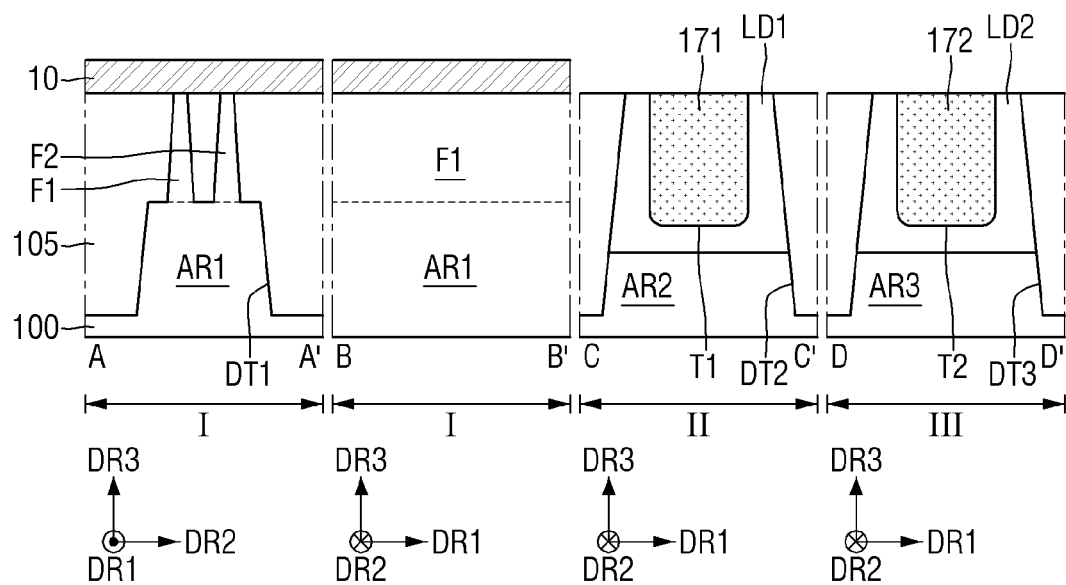

Referring to FIG. 8, a first protective layer 10 may be formed on the field insulating layer 105, the first active pattern F1 and the second active pattern F2 of the first region I. Subsequently, impurities are injected into the second active region AR2, and the first low doping region LD1 may be formed. Further, impurities may be injected into the third active region AR3, and the second low doping region LD2 may be formed.

A lower surface of the first low doping region LD1 may be formed to be lower than a lower surface of the first trench T1. Further, a lower surface of the second low doping region LD2 may be formed to be lower than a lower surface of the second trench T2. Hereafter, a portion protruding from the substrate 100 in the vertical direction DR3 in the lower part of the first low doping region LD1 is defined as the second active region AR2, and a portion protruding from the substrate 100 in the vertical direction DR3 in the lower part of the second low doping region LD2 is defined as the third active region AR3.

Figure 9:
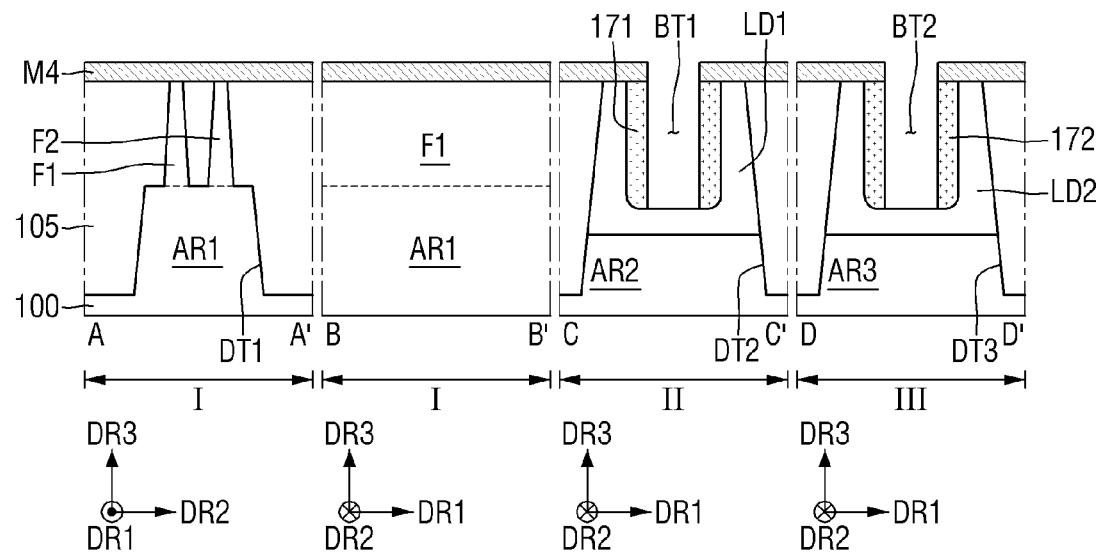

Referring to FIG. 9, the first protective layer 10 may be removed. Subsequently, the fourth mask pattern M4 may be formed on the first to third regions I, II and III. Subsequently, the first buried trench BT1 may be formed, by etching part of the first buried insulating layer 171 using the fourth mask pattern M4 as a mask. Further, the second buried trench BT2 may be formed, by etching part of the second buried insulating layer 172 using the fourth mask pattern M4 as a mask.

The first low doping region LD1 may be exposed by the first buried trench BT1. Further, the second low doping region LD2 may be exposed by the second buried trench BT2. The remaining part of the first buried insulating layer 171 may remain on both side walls of the first buried trench BT1 in the first horizontal direction DR1. Further, the remaining part of the second buried insulating layer 172 may remain on both side walls of the second buried trench BT2 in the first horizontal direction DR1.

Figure 10:
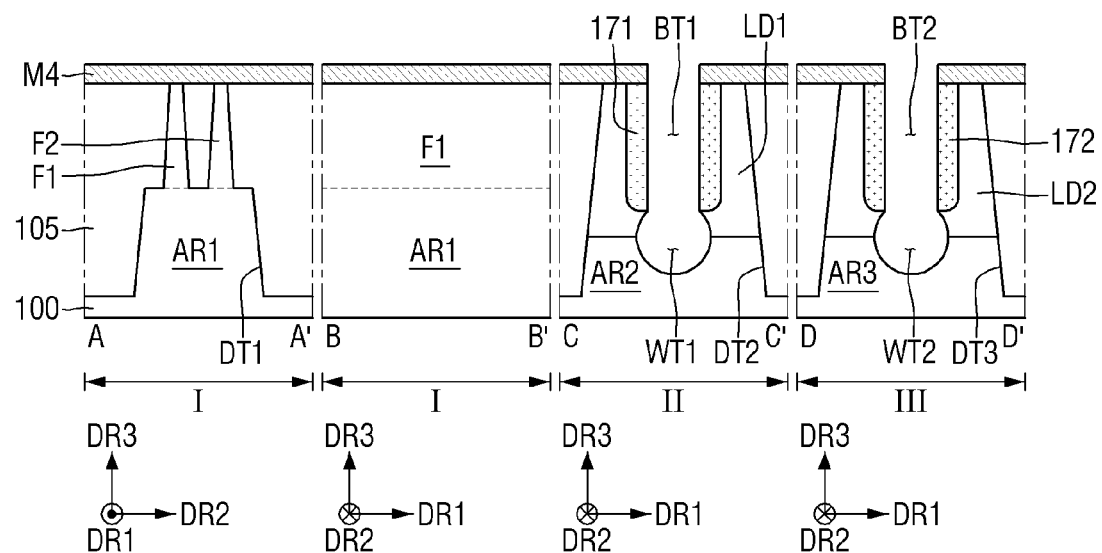

Referring to FIG. 10, the first wing trench WT1 may be formed in the lower part of the first buried trench BT1 through a bottom surface of the first buried trench BT1. Further, the second wing trench WT2 may be formed in the lower part of the second buried trench BT2 through a bottom surface of the second buried trench BT2.

The first wing trench WT1 may extend into the second active region AR2. That is, the bottom surface of the first wing trench WT1 may be formed to be lower than the upper surface of the second active region AR2. Further, the second wing trench WT2 may extend into the third active region AR3. That is, the bottom surface of the second wing trench WT2 may be formed to be lower than the upper surface of the third active region AR3.

The side walls of the first wing trench WT1 may extend laterally from the side walls of the first buried trench BT1. Further, the side walls of the second wing trench WT2 may extend laterally from the side walls of the second buried trench BT2. The "width" of the first wing trench WT1 (e.g., measured in the first horizontal direction DR1) may be greater than the width of the first buried trench BT1. Further, the width of the second wing trench WT2 may be greater than the width of the second buried trench BT2. For example, the width of the first wing trench WT1 may be less than the width between both outer walls of the first buried insulating layer 171. Further, the width of the second wing trench WT2 may be less than the width between both outer walls of the second buried insulating layer 172.

Figure 11:
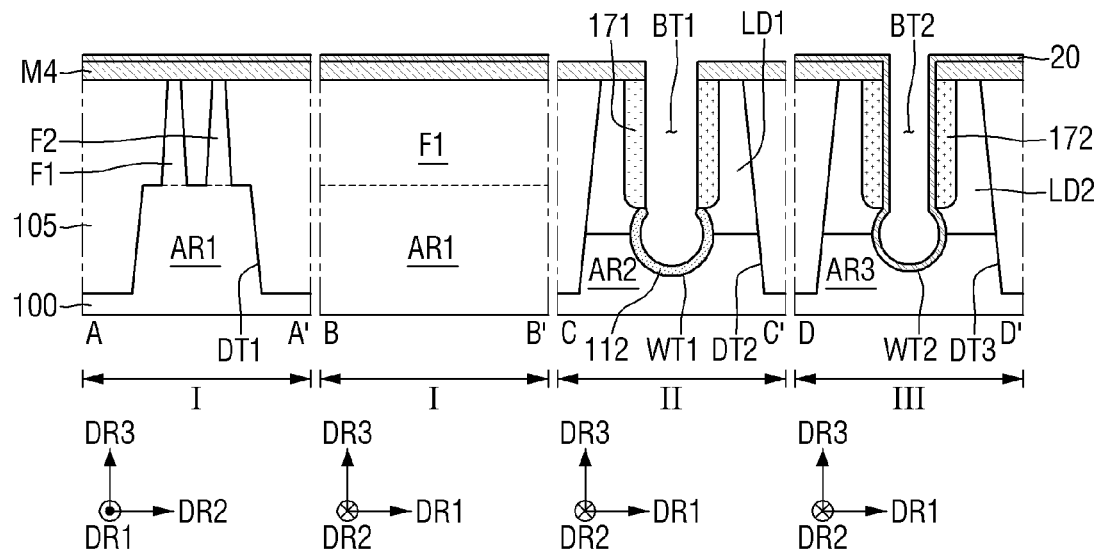

Referring to FIG. 11, a second protective layer 20 may be formed on the first region I and the third region III. The second protective layer 20 may be formed on the fourth mask pattern M4 on the first region I and the third region III. Further, on the third region III, the second protective layer 20 may be formed along the side walls of the second buried trench BT2, and the side walls and the bottom surface of the second wing trench WT2. In some embodiments, the second protective layer 20 may be conformally formed. The second protective layer 20 may include, for example, silicon nitride (SiN).

Subsequently, the second insulating layer 112 may be formed on the side walls and the bottom surface of the first wing trench WT1 through the thermal oxidation process. While the thermal oxidation process is in progress, part of the first low doping region LD1 and part of the second active region AR2 exposed on the side walls and the bottom surface of the first wing trench WT1 may be oxidized to form the second insulating layer 112. The second insulating layer 112 may also formed on part of the oxidized first low doping region LD1 and part of the oxidized second active region AR2.

Hereinafter, a trench defined by each of the boundary between the first low doping region LD1 and the second insulating layer 112 and the boundary between the second active region AR2 and the second insulating layer 112 will be defined as a first wing trench WT1. The first wing trench WT1 may be expanded through the thermal oxidation process. For example, the width of the first wing trench WT1 after the second insulating layer 112 is formed may be greater than the width of the first wing trench WT1 before the second insulating layer 112 is formed.

Figure 12:
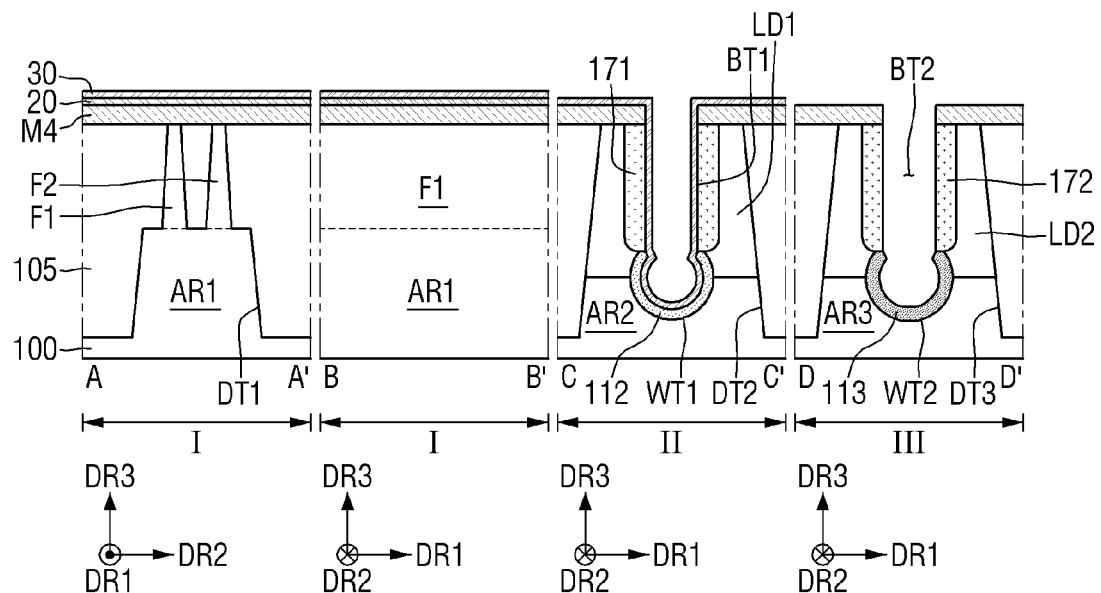

Referring to FIG. 12, the second protective layer 20 formed on the third region III may be removed. Subsequently, a third protective layer 30 may be formed on the first region I and the second region II. On the first region I, the third protective layer 30 may be formed on the second protective layer 20. Further, on the second region II, the third protective layer 30 may be formed along the fourth mask pattern M4, the side walls of the first buried trench BT1, and the second insulating layer 112. In some embodiments, the third protective layer 30 may be conformally formed. The third protective layer 30 may include, for example, silicon nitride (SiN).

Subsequently, the third insulating layer 113 may be formed on the side walls and the bottom surface of the second wing trench WT2 through the thermal oxidation process. While the thermal oxidation process is in progress, part of the second low doping region LD2 and part of the third active region AR3 exposed on the side walls and the bottom surface of the second wing trench WT2 may be oxidized to form the third insulating layer 113. The third insulating layer 113 may also be formed on part of the oxidized second low doping region LD2 and part of the oxidized third active region AR3.

Hereinafter, a trench defined by each of the boundary between the second low doping region LD2 and the third insulating layer 113 and the boundary between the third active region AR3 and the third insulating layer 113 may be defined as a second wing trench WT2. The second wing trench WT2 may be expanded through the thermal oxidation process. For example, the width of the second wing trench WT2 after the third insulating layer 113 is formed may be greater than the width of the second wing trench WT2 before the third insulating layer 113 is formed. Here, the thickness of the third insulating layer 113 may be greater than the thickness of the second insulating layer 112.

Figure 13:
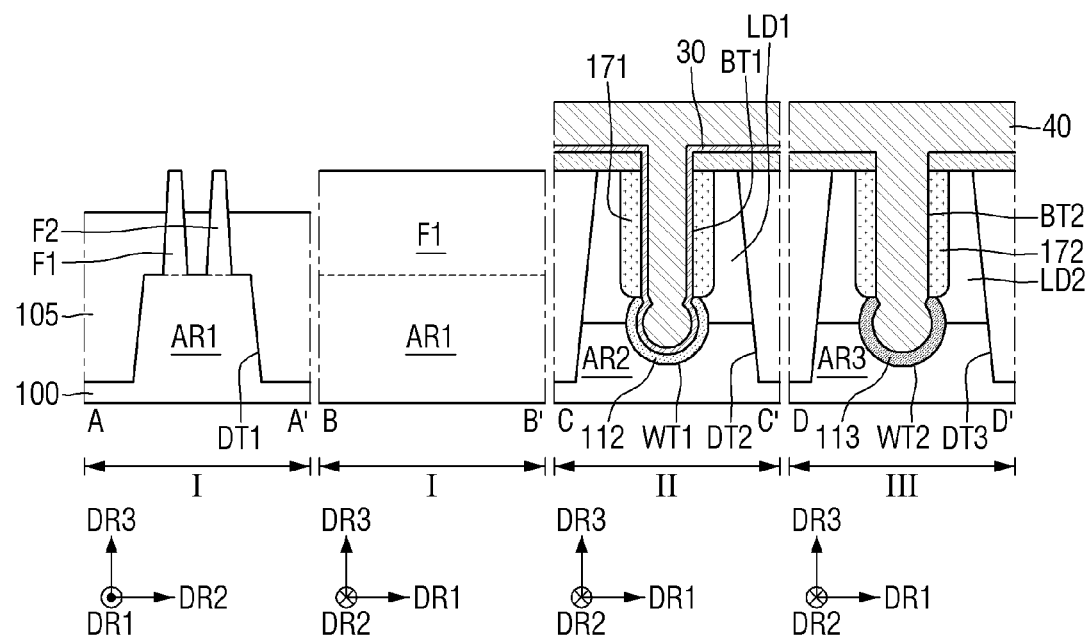

Referring to FIG. 13, a fourth protective layer 40 may be formed on the second region II and the third region III. Next, the third protective layer 30, the second protective layer 20, and the fourth mask pattern M4 on the first region I may be etched, using the fourth protective layer 40 as a mask. Further, part of the field insulating layer 105 may be etched to expose part of the upper parts of each of the first and second active patterns F1 and F2.

Figure 14:
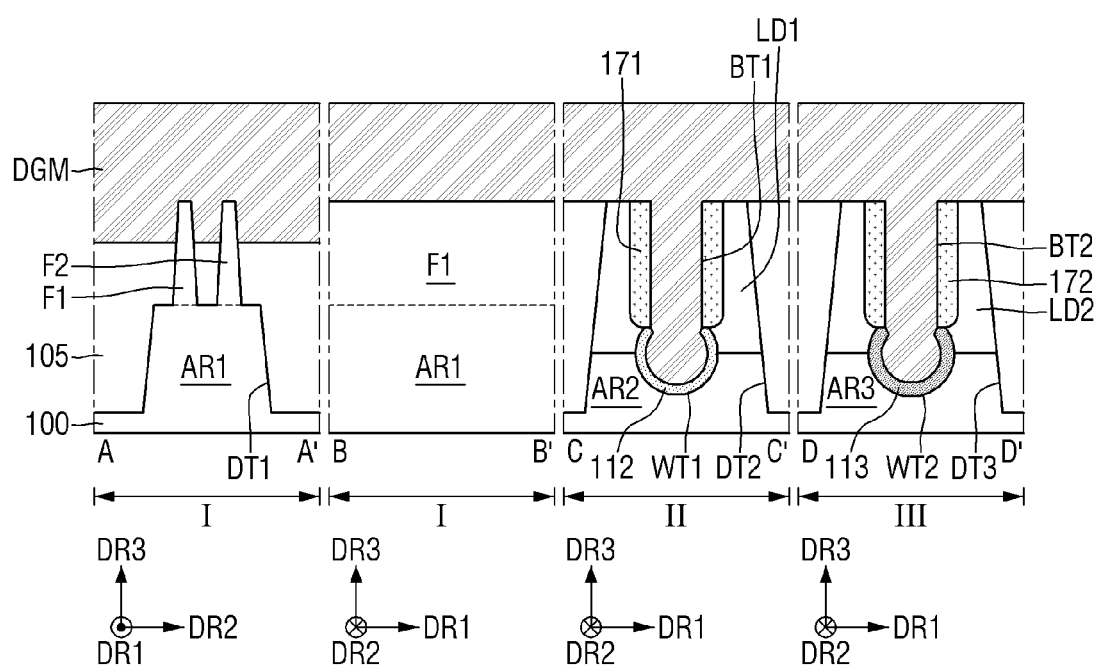

Referring to FIG. 14, the fourth protective layer 40 on the second region II and the third region III may be removed. Further, the third protective layer 30 on the second region II may be removed. Next, a dummy gate material layer DGM may be formed on the field insulating layer 105, the first and second active patterns F1 and F2, the upper surface of the first low doping region LD1, the upper surface of the second low doping region LD2, the upper surface of the first buried insulating layer 171 and the upper surface of the second buried insulating layer 172, on the first to third regions I, II and III. The dummy gate material layer DGM may also be formed within each of the first buried trench BT1, the second buried trench BT2, the first wing trench WT1, and the second wing trench WT2.

Figure 15:
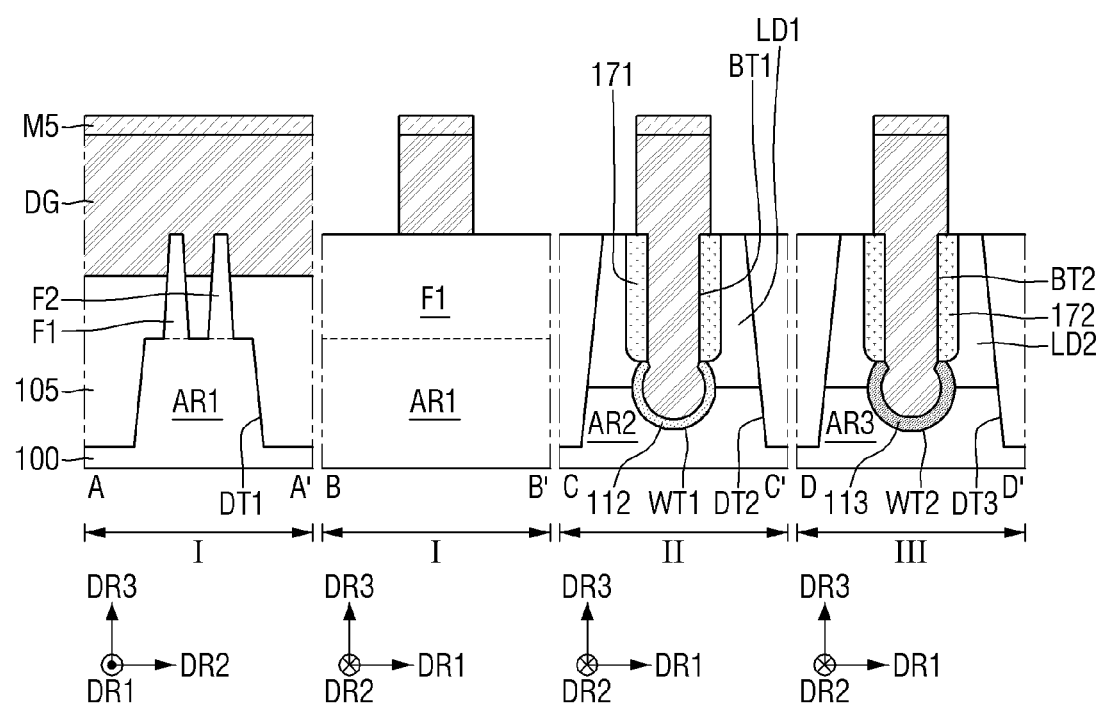

Referring to FIG. 15, a fifth mask pattern M5 may be formed on the dummy gate material layer DGM. Next, the dummy gate material layer DGM may be etched, using the fifth mask pattern M5 as a mask. Through such an etching process, a plurality of dummy gates DG extending in the second horizontal direction DR2 may be formed on each of the first to third regions I, II and III.

For example, the dummy gate DG formed on the second region II may overlap part of the first buried insulating layer 171 in the vertical direction DR3. Further, the dummy gate DG formed on the third region III may overlap part of the second buried insulating layer 172 in the vertical direction DR3.

Figure 16:
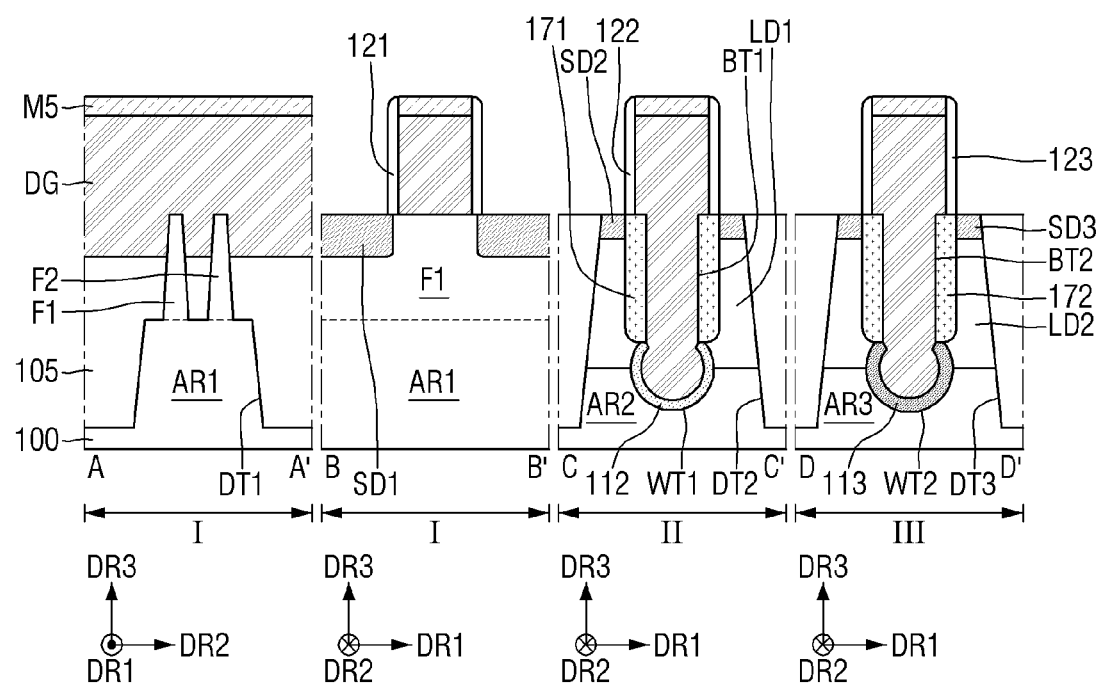

Referring to FIG. 16, a gate spacer may be formed on both side walls of the plurality of dummy gates DG in the first horizontal direction DR1. For example, the first gate spacer 121 is formed on both side walls of the dummy gate DG on the first region I, the second gate spacer 122 is formed on both side walls of the dummy gate DG on the second region II, and the third gate spacer 123 may be formed on both side walls of the dummy gate DG on the third region III.

The first gate spacer 121 may also be formed on the side walls of the fifth mask pattern M5 on the first region I. The second gate spacer 122 may also be formed on the side walls of the fifth mask pattern M5 on the second region II. The third gate spacer 123 may also be formed on the side walls of the fifth mask pattern M5 on the third region III.

Subsequently, the first source/drain region SD1 may be formed on the first active pattern F1. Further, the second source/drain region SD2 may be formed within the first low doping region LD1, and the third source/drain region SD3 may be formed within the second low doping region LD2.

Figure 17:
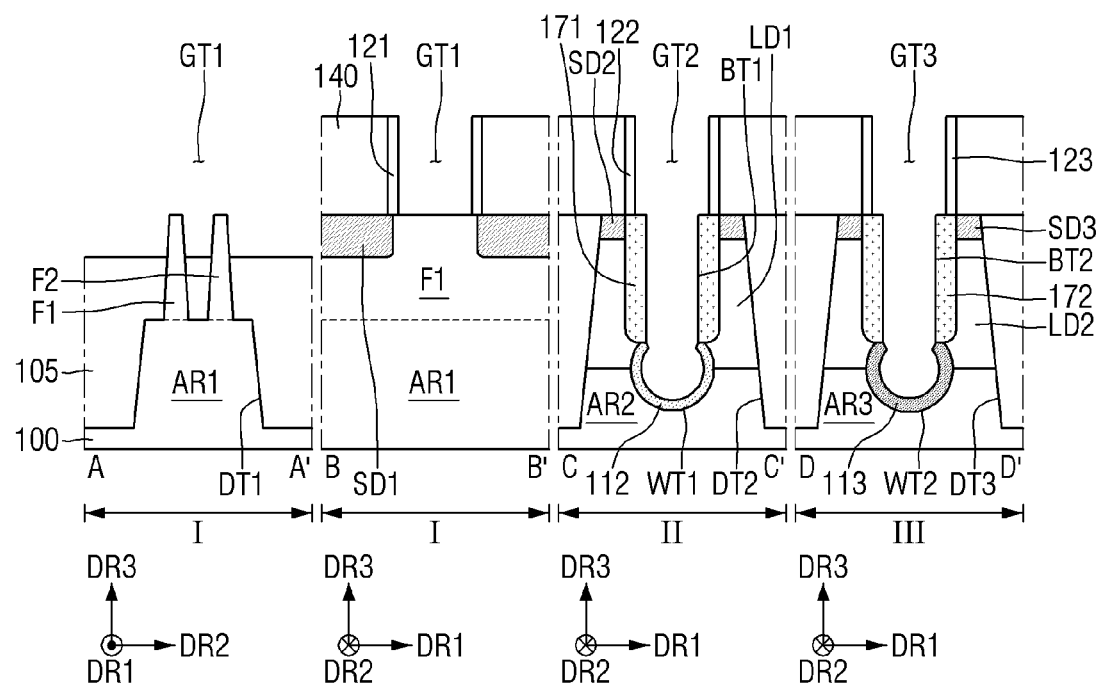

Referring to FIG. 17, the first interlayer insulating layer 140 may be formed to cover the first to third gate spacers 121, 122 and 123, the first to third source/drain regions SD1, SD2 and SD3, and the fifth mask pattern M5. Subsequently, part of the first interlayer insulating layer 140 and the fifth mask pattern M5 may be etched through the flattening process to expose a plurality of dummy gates DG.

After that, the plurality of dummy gates DG may be removed to form the first to third gate trenches GT1, GT2, and GT3. For example, a first gate trench GT1 may be defined by the first gate spacer 121 on the first active pattern F1 on the first region I. A second gate trench GT2 may be defined by the second gate spacer 122 on the second region II. A third gate trench GT3 may be defined by the third gate spacer 123 on the third region III.

Figure 18:
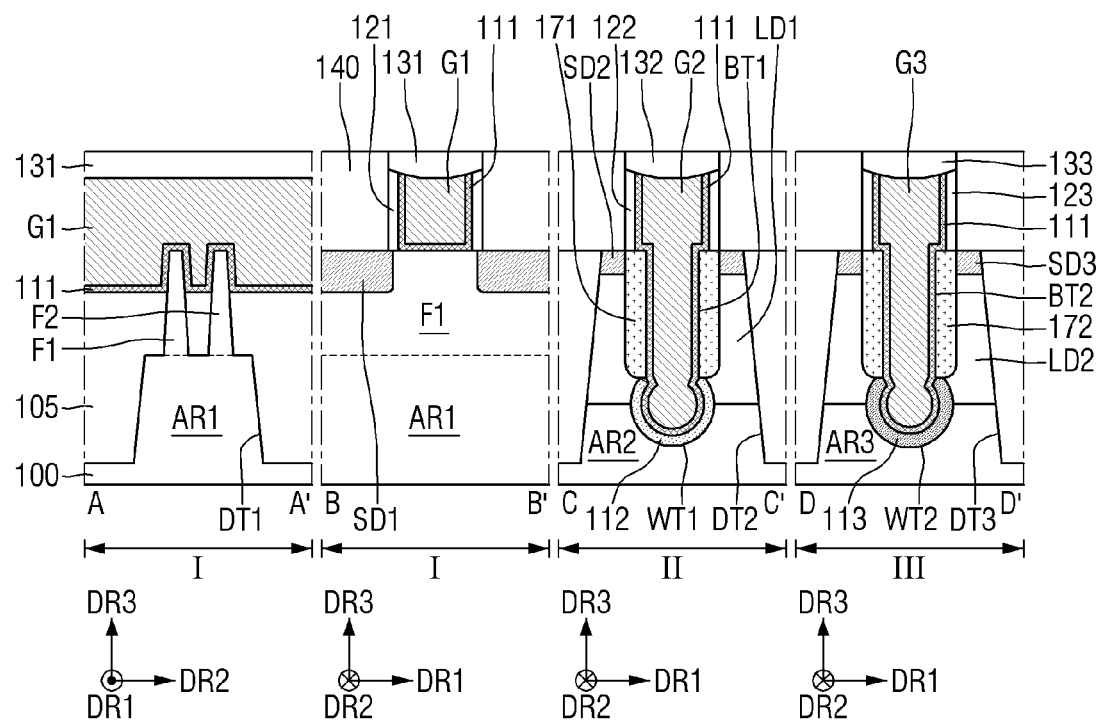

Referring to FIGS. 17 and 18, the first insulating layer 111 may be formed along the side walls and a bottom surface of the first gate trench (GT1 of FIG. 17). Further, the first insulating layer 111 may be formed on the side walls of the second gate trench (GT2 of FIG. 17), the second insulating layer 112, and the side walls of the first buried trench BT1.

Further, the first insulating layer 111 may be formed on the side walls of the third gate trench (GT3 of FIG. 17), the third insulating layer 113, and the side walls of the second buried trench BT2.

Subsequently, a gate electrode may be formed on the first insulating layer 111. For example, the first gate electrode G1 may be formed on the first insulating layer 111 within the first gate trench (GT1 of FIG. 17). Further, a second gate electrode G2 may be formed on the first insulating layer 111 within each of the second gate trench (GT2 of FIG. 17), the first buried trench BT1, and the first wing trench WT1. Further, a third gate electrode G3 may be formed on the first insulating layer 111 within each of the third gate trench (GT3 of FIG. 17), the second buried trench BT2, and the second wing trench WT2.

Subsequently, the first capping pattern 131 may be formed on the first gate electrode G1, the first insulating layer 111, and the first gate spacer 121. Further, the second capping pattern 132 may be formed on the second gate electrode G2, the first insulating layer 111, and the second gate spacer 122. Further, the third capping pattern 133 may be formed on the third gate electrode G3, the first insulating layer 111, and the third gate spacer 123.

Referring back to FIG. 2, the etching stop layer 150 and the second interlayer insulating layer 160 may be sequentially formed on each of the first interlayer insulating layer 140 and the first to third capping patterns 131, 132 and 133 to substantially complete the manufacturing of the semiconductor device of FIGS. 1 and 2.

Of further note in relation to methods of manufacturing semiconductor devices according to embodiments of the inventive concept, after the deep trenches DT1, DT2, and DT3 are formed to thereby define the active regions AR1, AR2 and AR3, the buried trenches BT1 and BT2 extending into the active regions AR1, AR2 and AR3 in the vertical direction DR3 may be formed. Next, the wing trenches WT1 and WT2 having widths greater than the widths of the buried trenches BT1 and BT2 may be formed through the lower parts of the buried trenches BT1 and BT2. Using this approach, it is possible to improve the structural stability of constituent semiconductor devices during process(es) forming the buried trenches BT1 and BT2 and the wing trenches WT1 and WT2.

Accordingly, semiconductor devices consistent with certain embodiments of the inventive concept may be manufactured using methods that provide a structure in which widths of the wing trenches WT1 and WT2 formed in the lower parts of the buried trenches BT1 and BT2 are greater than the widths of the buried trenches BT1 and BT2.

Hereinafter, another semiconductor device according to embodiments of the inventive concept will be described in relation to FIG. 19. Thus description will be drawn principally to material differences between the semiconductor device of FIG. 19 and semiconductor device of FIG. 2.

Figure 19:
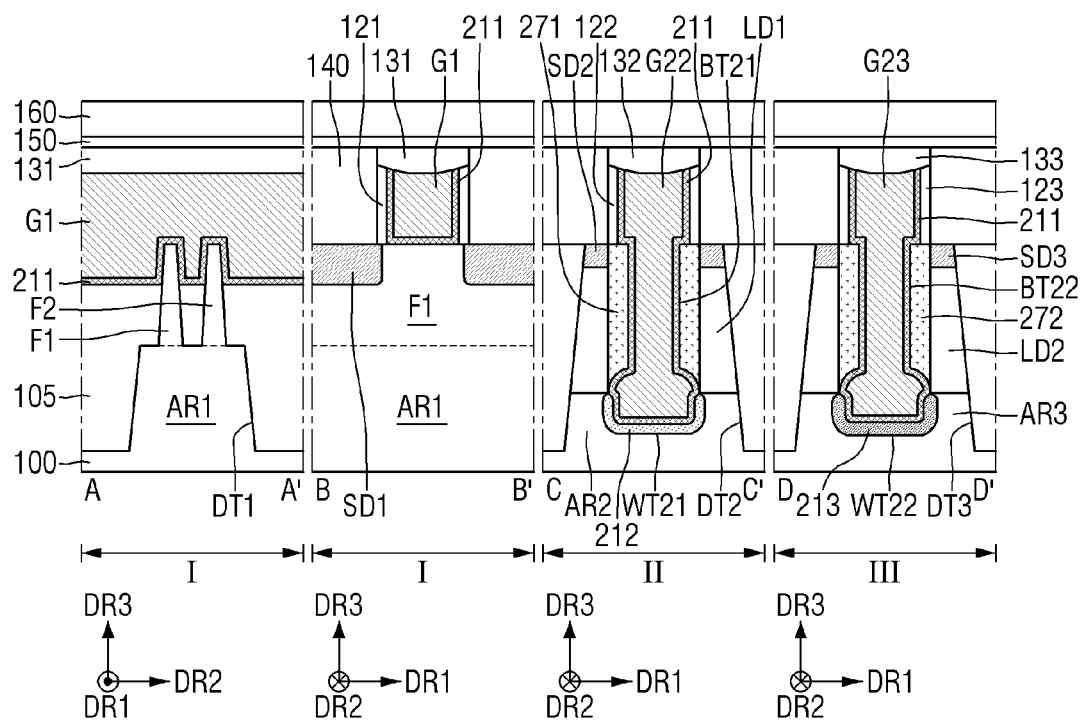
FIG. 19 is a plan (or top-down) view illustrating a semiconductor device according to embodiments of the inventive concept.

FIG. 19 is a cross-sectional view illustrating a semiconductor device according to embodiments of the inventive concept.

Referring to FIG. 19, in the illustrated semiconductor device, the width of a first wing trench WT21 (e.g., a dimension measured in the first horizontal direction DR1) may be greater than the width between both outer walls of the first buried insulating layer 271. Further, the width of a second wing trench WT2 may be greater than the width between both outer walls of the second buried insulating layer 272.

The second insulating layer 212 may be disposed along the side walls and the bottom surface of the first wing trench WT21. The first insulating layer 211 may be disposed on the first region I along the side walls and the bottom surface of the first gate electrode G1. In the second region II, the first insulating layer 211 may be disposed on the lower surfaces of the second insulating layer 212 and the first buried insulating layer 271 within the first wing trench WT21. Further, in the second region II, the first insulating layer 211 may be disposed on the side walls of the first buried trench BT21. Further, in the second region II, the first insulating layer 211 may be disposed between the second gate electrode G22 and the second gate spacer 122.

The third insulating layer 213 may be disposed along the side walls and the bottom surface of the second wing trench WT22. In the third region III, the first insulating layer 211 may be disposed on the lower surfaces of the third insulating layer 213 and the second buried insulating layer 272 within the second wing trench WT22. Further, in the third region III, the first insulating layer 211 may be disposed on the side walls of the second buried trench BT22. Further, the first insulating layer 211 may be disposed between the third gate electrode G23 and the third gate spacer 123 on the third region III.

Hereinafter, a method of manufacturing semiconductor devices according to embodiments of the inventive concept will be described in relation to related cross-sectional views of FIGS. 20 to 33, and primarily in the context of material differences with the method of manufacture previously described in relation to FIGS. 3 to 18.

Figure 20:
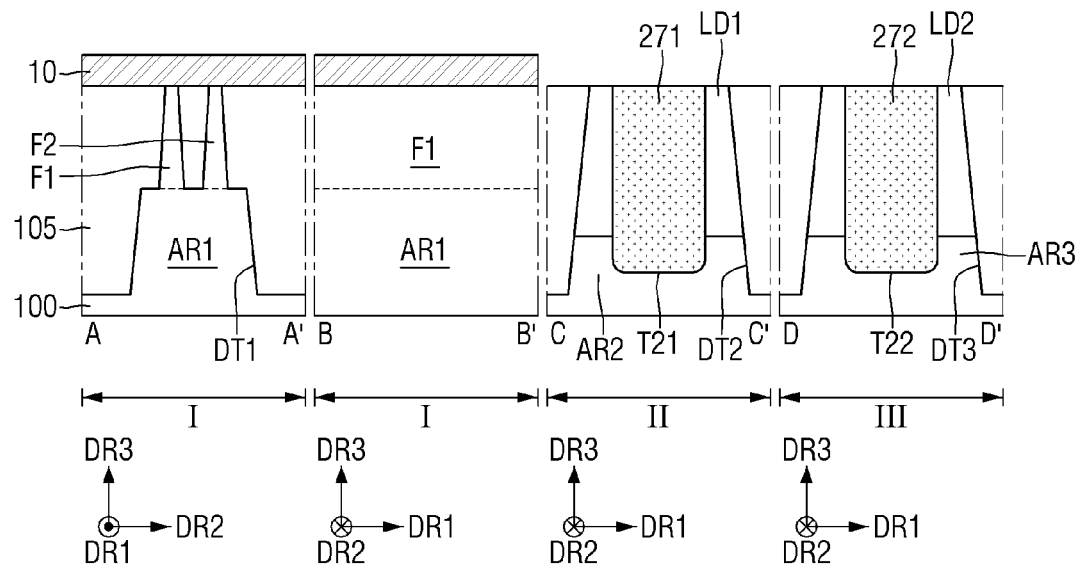
FIGS. 20, 21, 22, 23, 24, 25, 26, 27, 28, 29, 30, 31, 32 and 33 (hereafter collectively, "FIGS. 20 to 33") are related cross-sectional view illustrating a method of manufacture for semiconductor devices according to embodiments of the inventive concept.

Referring to FIG. 20, after the methods steps of FIGS. 3, 4, 5, 6, and 7 have been performed, the first protective layer 10 may be disposed on the field insulating layer 105, the first active pattern F1 and the second active pattern F2 of the first region I. Subsequently, impurities may be injected into the second active region AR2 to form the first low doping region LD1. Further, impurities may be injected into the third active region AR3 to form the second low doping region LD2.

A lower surface of the first low doping region LD1 may be formed at a higher level than a lower surface of the first trench T21. Further, a lower surface of the second low doping region LD2 may be formed at a lower level than a lower surface of the second trench T22. During the step of forming the first trench (T1 of FIG. 3) and the second trench (T2 of FIG. 3) shown in FIG. 3, by forming the trench to be deeper than each of the first trench (T1 of FIG. 3) and the second trench (T2 of FIG. 3), each of the first trench T21 and the second trench T22 shown in FIG. 20 may be formed.

Figure 21:
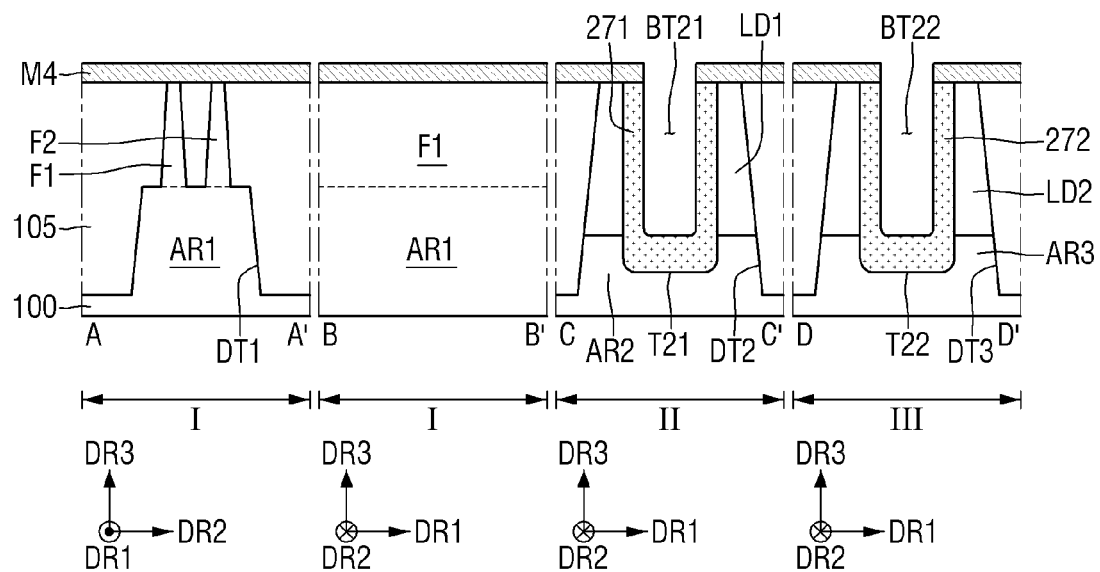

Referring to FIG. 21, the first protective layer 10 may be removed. Subsequently, the fourth mask pattern M4 may be formed in the first, second and third regions I, II and III. Subsequently, by etching part of the first buried insulating layer 271 using the fourth mask pattern M4 as a mask, the first buried trench BT21 may be formed. Further, by etching part of the second buried insulating layer 272 using the fourth mask pattern M4 as a mask, the second buried trench BT22 may be formed.

A bottom surface of the first buried trench BT21 may be formed at a higher level than a lower surface of the first buried insulating layer 271. Further, a bottom surface of the second buried trench BT22 may be formed at a higher level than a lower surface of the second buried insulating layer 272.

Figure 22:
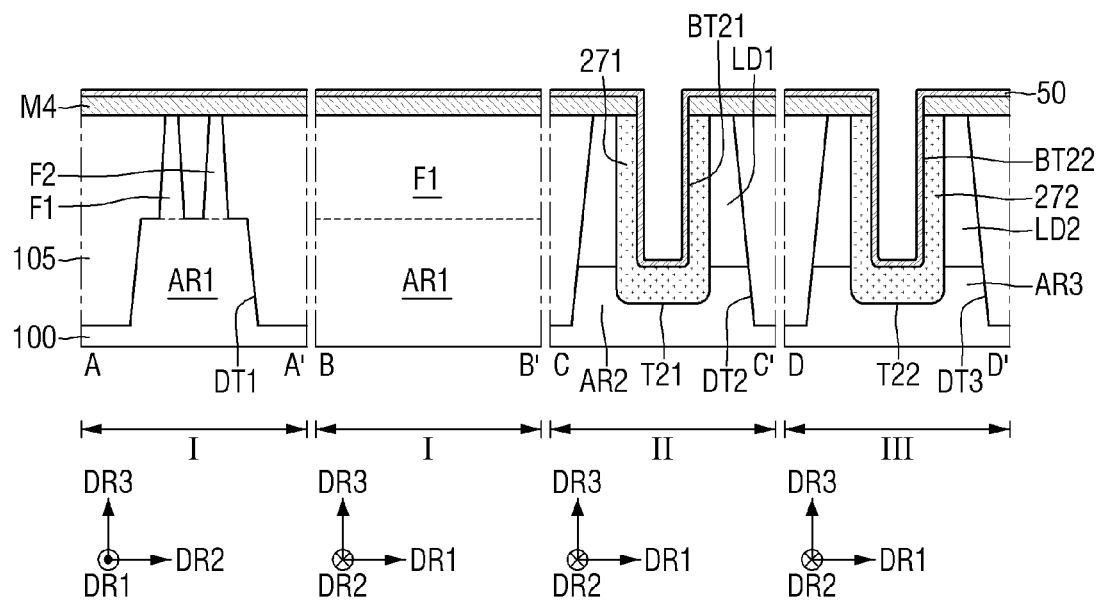

Referring to FIG. 22, a fifth protective layer 50 may be formed along the upper surface of the fourth mask pattern M4, the side walls and bottom surface of the first buried trench BT21, and the side walls and bottom surface of the second buried trench BT22. In some embodiments, the fifth protective layer 50 may be conformally formed. The fifth protective layer 50 may include, for example, silicon nitride (SiN).

Figure 23:
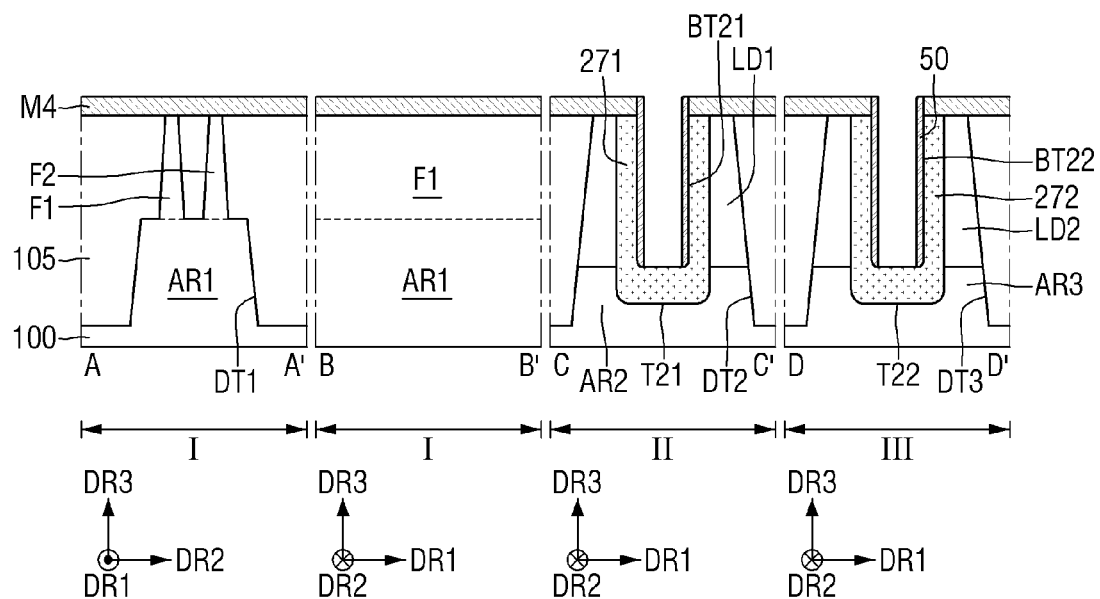

Referring to FIG. 23, the fifth protective layer 50 formed on the upper surface of the fourth mask pattern M4, the bottom surface of the first buried trench BT21, and the bottom surface of the second buried trench BT22 may be etched using an etch-back process. Through the etch-back process, the first buried insulating layer 271 may be exposed on the bottom surface of the first buried trench BT21, and the second buried insulating layer 272 may be exposed on the bottom surface of the second buried trench BT22.

Figure 24:
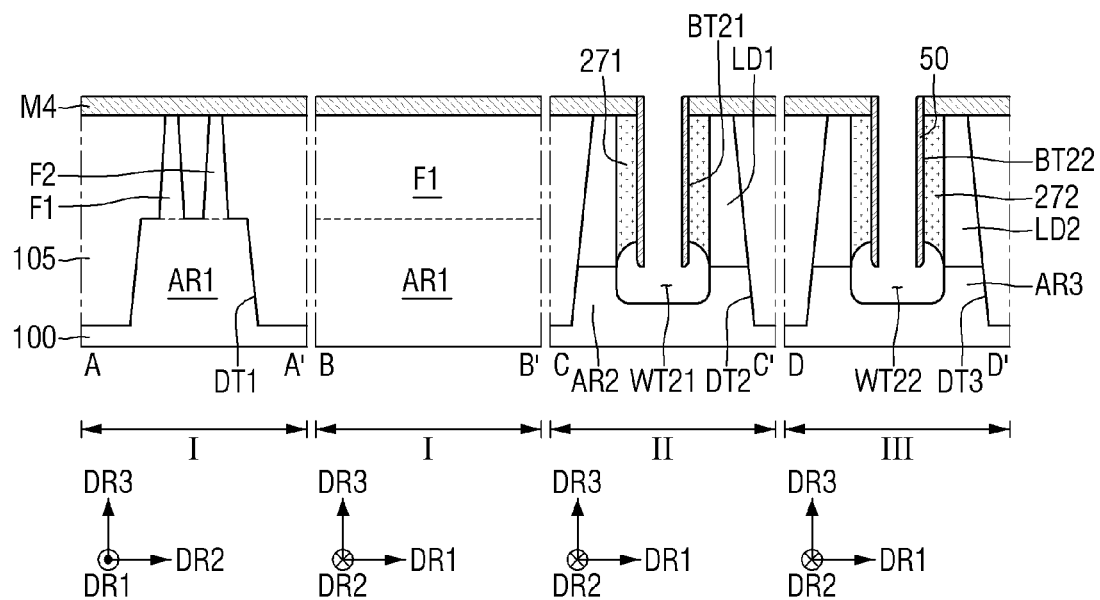

Referring to FIG. 24, the first wing trench WT21 may be formed in the lower part of the first buried trench BT21 through the bottom surface of the first buried trench BT21. Further, the second wing trench WT22 may be formed in the lower part of the second buried trench BT22 through the bottom surface of the second buried trench BT22.

The first wing trench WT21 may be formed by etching the first buried insulating layer 271 formed on the lower part of the first buried trench BT21 and the lower side walls of the first buried trench BT21. The second wing trench WT22 may be formed by etching the second buried insulating layer 272 formed on the lower part of the second buried trench BT22 and the lower side walls of the second buried trench BT22.

The side walls of the first wing trench W21 may extend laterally from the side walls of the first buried trench BT21. Further, the side walls of the second wing trench WT22 may extend laterally from the side walls of the second buried trench BT22. The width of the first wing trench WT21 may be greater than the width of the first buried trench BT21. Further, the width of the second wing trench WT2 may be greater than the width of the second buried trench BT2. In some embodiments, the width of the first wing trench WT21 may be equal to the width between both outer walls of the first buried insulating layer 271. Further, the width of the second wing trench WT2 may be the same as the width between both outer walls of the second buried insulating layer 272.

Figure 25:
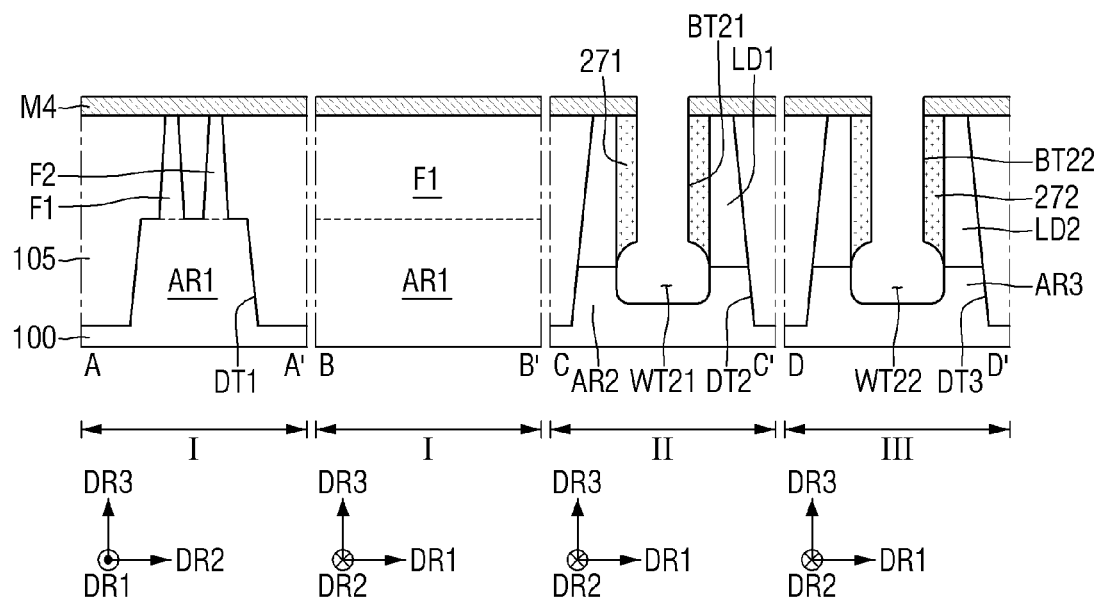

Referring to FIG. 25, the fifth protective layer 50 may be removed. For example, part of the upper part of the fourth mask pattern M4 may be removed while removing the fifth protective layer 50.

Figure 26:
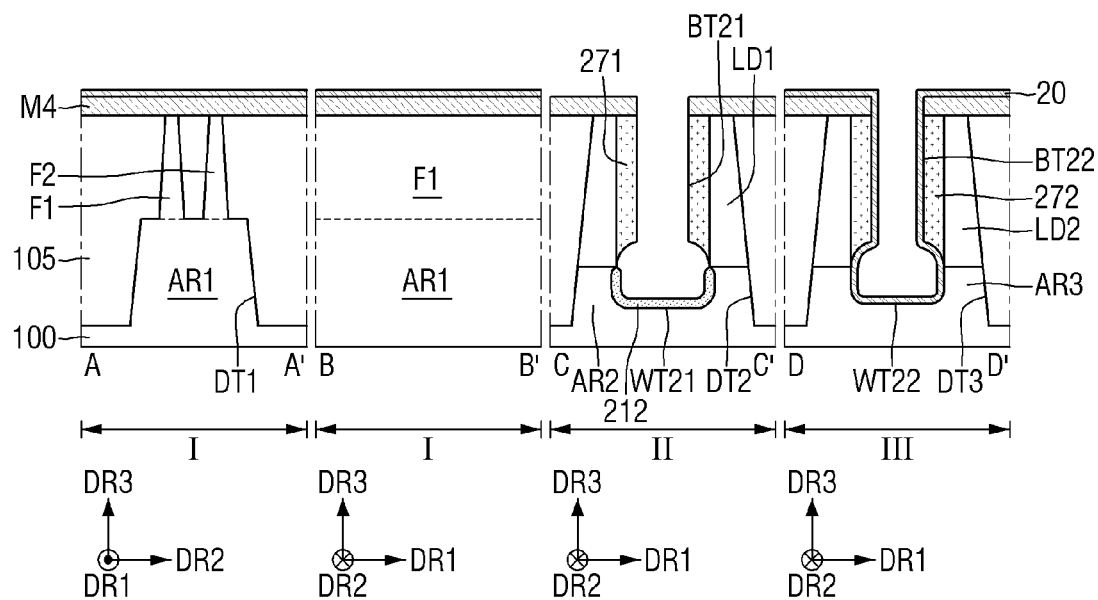

Referring to FIG. 26, a second protective layer 20 may be formed on the first region I and the third region III. The second protective layer 20 may be formed on the fourth mask pattern M4 on the first region I and the third region III. Further, the second protective layer 20 may be formed along the side walls of the second buried trench BT22, and the side walls and the bottom surface of the second wing trench WT22, on the third region III.

Subsequently, the second insulating layer 212 may be formed on the side walls and the bottom surface of the first wing trench WT21 through the thermal oxidation process. The second insulating layer 212 is not formed on the lower surface of the first buried insulating layer 271 exposed by the first wing trench WT21. While the thermal oxidation process is in progress, part of the second active region AR2 exposed to the side walls and the bottom surface of the first wing trench WT21 may be oxidized to form the second insulating layer 212. The second insulating layer 212 may also be formed on part of the oxidized second active region AR2.

Hereinafter, the trench defined at the boundary between the second active region AR2 and the second insulating layer 212 may be defined as the first wing trench WT21. The first wing trench WT21 may be expanded through the thermal oxidation process. For example, the width of the first wing trench WT21 following formation of the second insulating layer 212 may be greater than the width of the first wing trench WT21 following formation of the second insulating layer 212.

Figure 27:
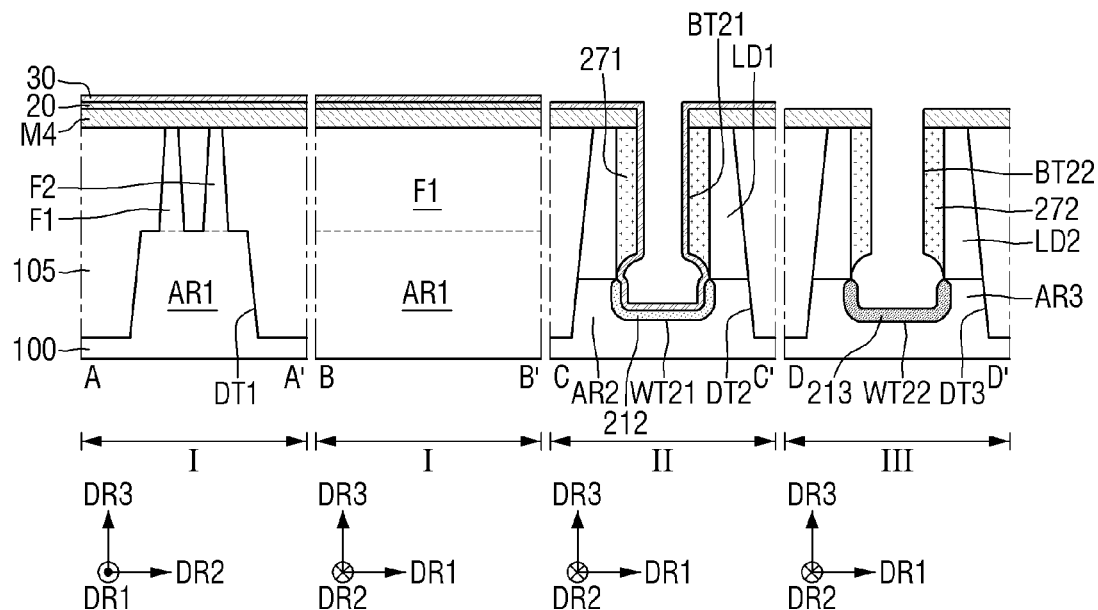

Referring to FIG. 27, the second protective layer 20 formed on the third region III may be removed. Subsequently, a third protective layer 30 may be formed on the first region I and the second region II. In the first region I, the third protective layer 30 may be formed on the second protective layer 20. Further, in the second region II, the third protective layer 30 may be formed along the fourth mask pattern M4, the side walls of the first buried trench BT21, and the second insulating layer 212.

Subsequently, the third insulating layer 213 may be formed on the side walls and the bottom surface of the second wing trench WT22 as the result of the thermal oxidation process. The third insulating layer 213 may not be formed on the lower surface of the second buried insulating layer 272 exposed by the second wing trench WT22. While the thermal oxidation process is in progress, part of the third active region AR3 exposed to the side walls and the bottom surface of the second wing trench WT22 may be oxidized to form the third insulating layer 213. The third insulating layer 213 may also be formed on part of the oxidized third active region AR3.

Hereinafter, the trench defined at the boundary between the third active region AR3 and the third insulating layer 213 may be defined as the second wing trench WT22. The second wing trench WT22 may be expanded through the thermal oxidation process. For example, the width of the second wing trench WT2 following formation the third insulating layer 213 may be greater than the width of the second wing trench WT22 following formation of the third insulating layer 213. Further, the thickness of the third insulating layer 213 may be greater than the thickness of the second insulating layer 212.

Figure 28:
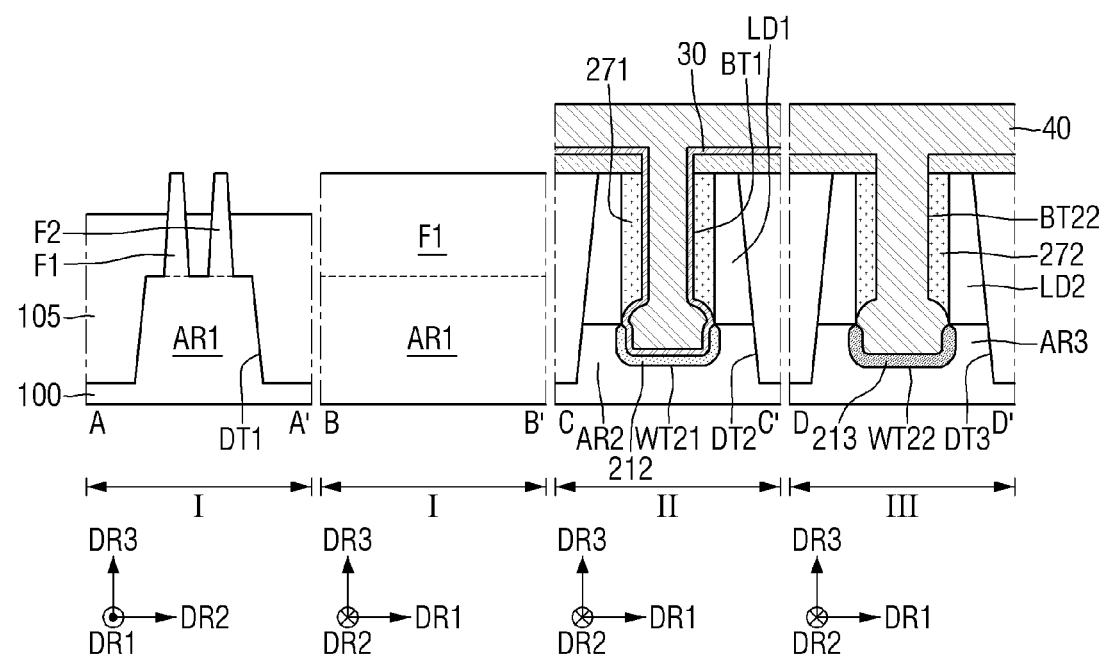

Referring to FIG. 28, the fourth protective layer 40 may be formed in the second region II and the third region III. Next, the third protective layer 30, the second protective layer 20, and the fourth mask pattern M4 on the first region I may be etched, using the fourth protective layer 40 as a mask. Further, part of the field insulating layer 105 may be etched to expose part of the upper parts of each of the first and second active patterns F1 and F2.

Figure 29:
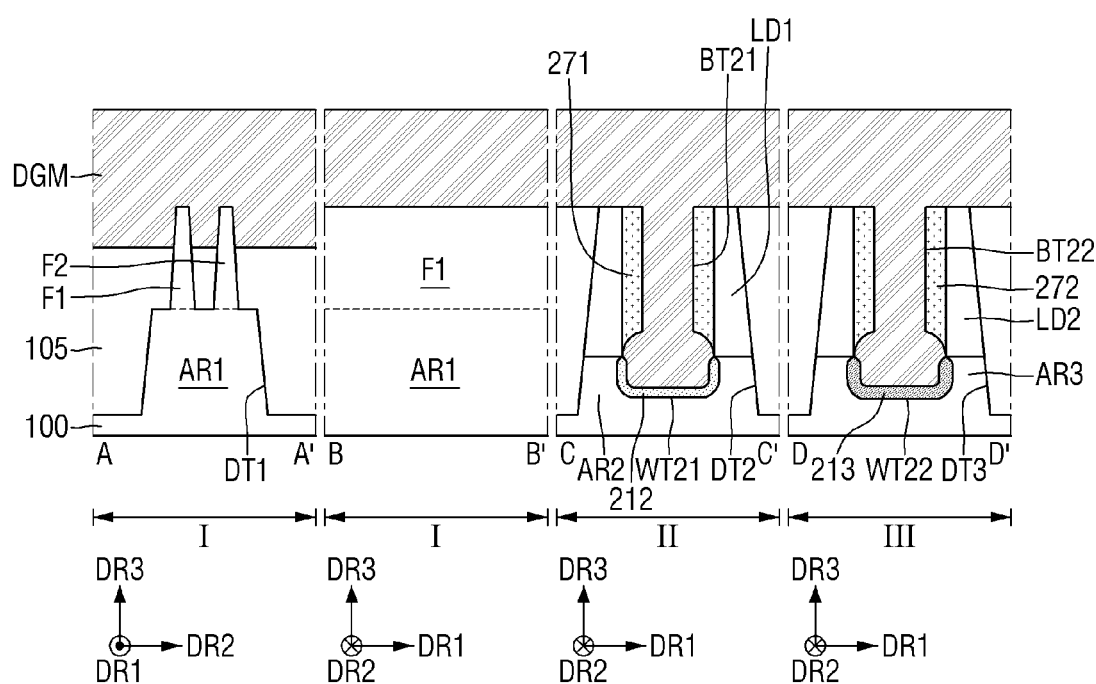

Referring to FIG. 29, the fourth protective layer 40 on the second region II and the third region III may be removed. Further, the third protective layer 30 on the second region II may be removed. Next, the dummy gate material layer DGM may be formed on the field insulating layer 105, the first and second active patterns F1 and F2, the upper surface of the first low doping region LD1, the upper surface of the second low doping region LD2, the upper surface of the first buried insulating layer 271, and the upper surface of the second buried insulating layer 272, on the first to third regions I, II and III. The dummy gate material layer DGM may also be formed within each of the first buried trench BT21, the second buried trench BT22, the first wing trench WT21, and the second wing trench WT22.

Figure 30:
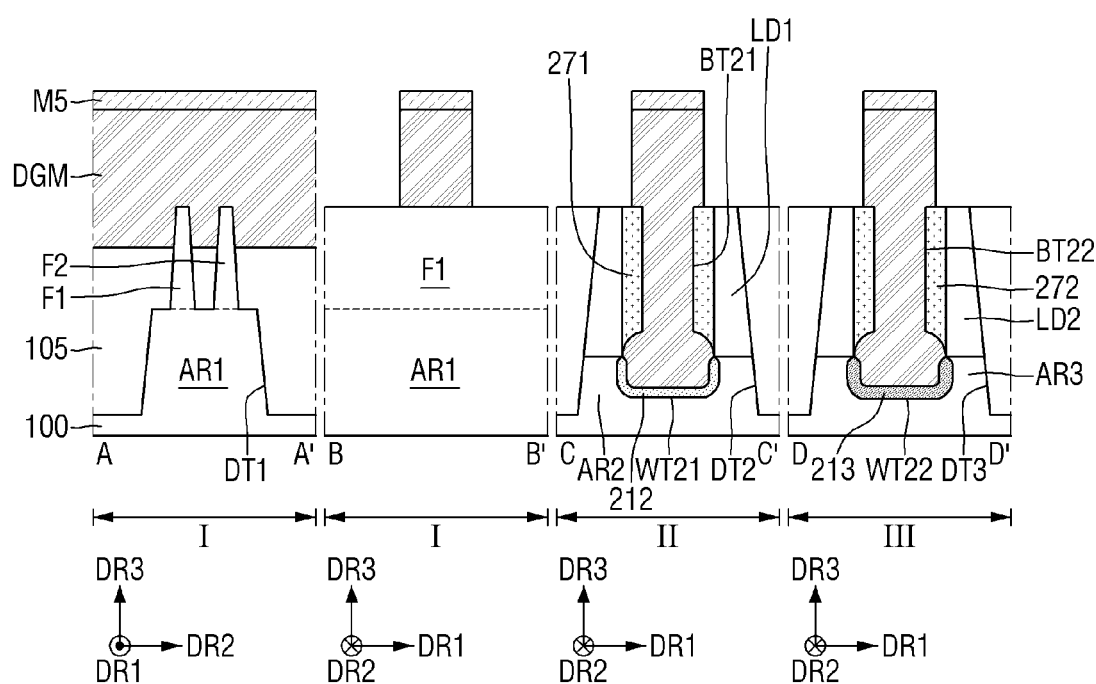

Referring to FIG. 30, the fifth mask pattern M5 may be formed on the dummy gate material layer DGM. Next, the dummy gate material layer DGM may be etched, using the fifth mask pattern M5 as a mask. As a result of the etching process, a plurality of dummy gates DG extending in the second horizontal direction DR2 may be formed on each of the first to third regions I, II and III.

Figure 31:
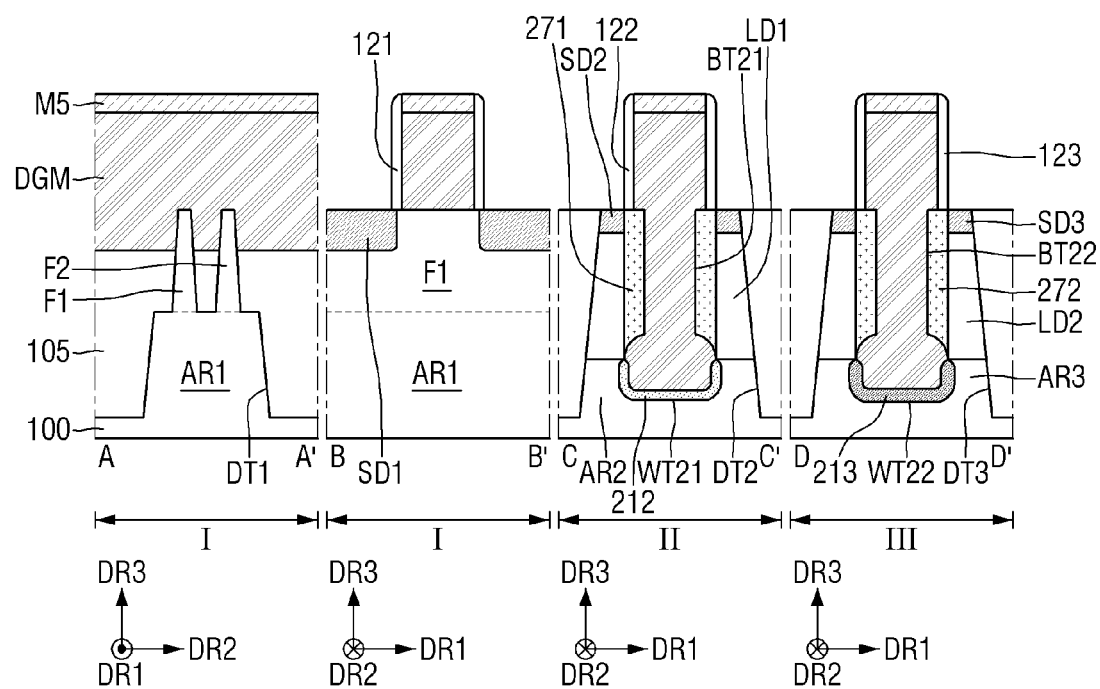

Referring to FIG. 31, a gate spacer may be formed on both side walls of the plurality of dummy gates DG in the first horizontal direction DR1. For example, the first gate spacer 121 is formed on both side walls of the dummy gate DG on the first region I, the second gate spacer 122 is formed on both side walls of the dummy gate DG on the second region II, and the third gate spacer 123 may be formed on both side walls of the dummy gate DG on the third region III.

Subsequently, the first source/drain region SD1 may be formed on the first active pattern F1. Further, the second source/drain region SD2 may be formed within the first low doping region LD1, and the third source/drain region SD3 may be formed within the second low doping region LD2.

Figure 32:
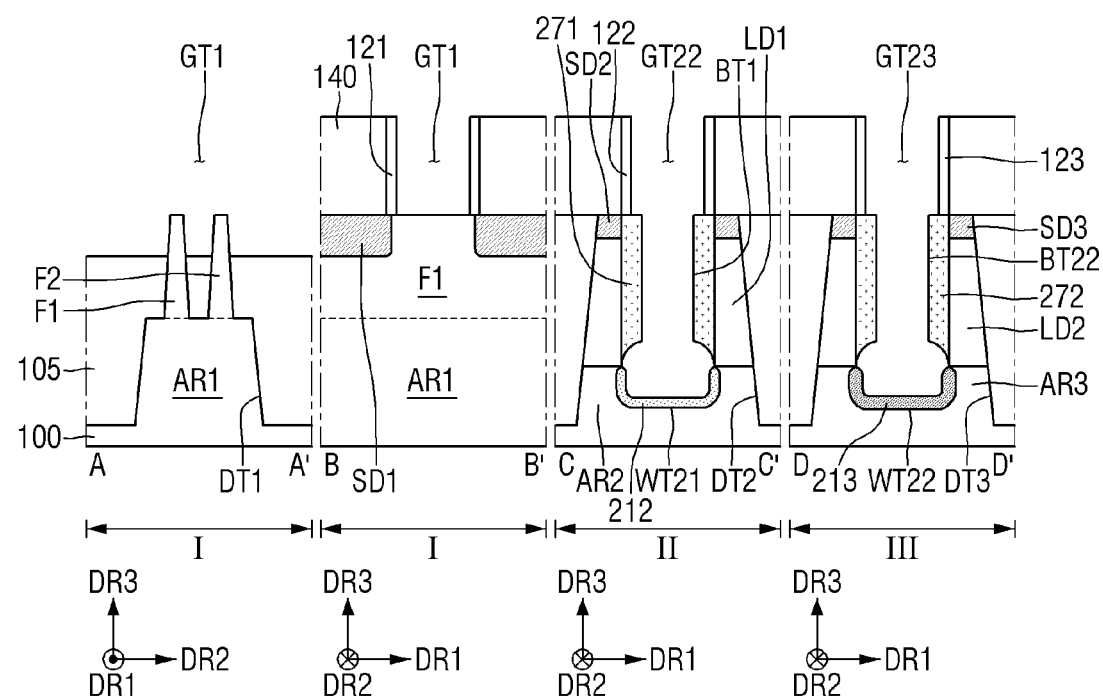

Referring to FIG. 32, the first interlayer insulating layer 140 may be formed to cover the first, second and third gate spacers 121, 122 and 123, the first, second and third source/drain regions SD1, SD2 and SD3, as well as the fifth mask pattern M5. Subsequently, part of the first interlayer insulating layer 140 and the fifth mask pattern M5 may be etched through the flattening process to expose a plurality of dummy gates DG. After that, the plurality of dummy gates DG may be removed to form the first to third gate trenches GT1, GT22, and GT23.

Figure 33:
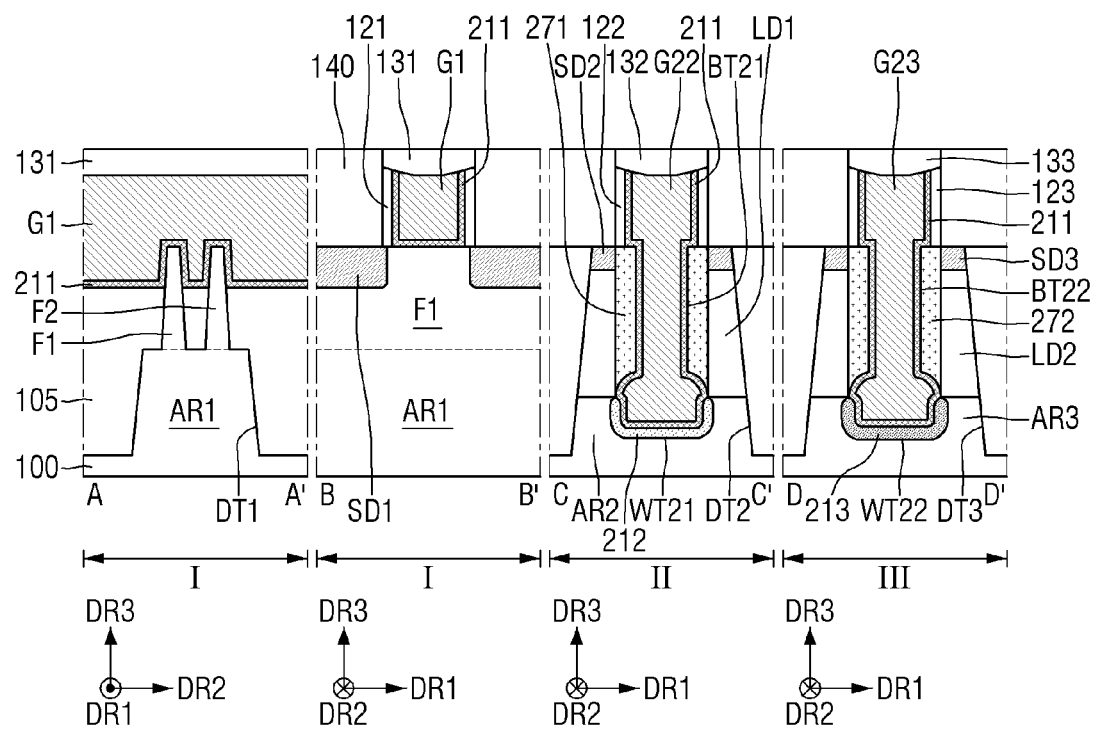

Referring to FIG. 33, the first insulating layer 211 may be formed along the side walls and bottom surface of the first gate trench (GT1 of FIG. 32). Further, the first insulating layer 211 may be formed on the side walls of the second gate trench (GT22 of FIG. 32), the second insulating layer 212, and the side walls of the first buried trench BT21. Further, the first insulating layer 211 may be formed on the side walls of the third gate trench (GT23 of FIG. 32), the third insulating layer 213, and the side walls of the second buried trench BT22.

Subsequently, a gate electrode may be formed on the first insulating layer 211. For example, the first gate electrode G1 may be formed on the first insulating layer 211 within the first gate trench (GT1 of FIG. 32). Further, a second gate electrode G22 may be formed on the first insulating layer 211 within each of the second gate trench (GT22 of FIG. 32), the first buried trench BT21, and the first wing trench WT21. Further, a third gate electrode G23 may be formed on the first insulating layer 211 within each of the third gate trench (GT23 of FIG. 32), the second buried trench BT22, and the second wing trench WT22.

Subsequently, the first capping pattern 131 may be formed on the first gate electrode G1, the first insulating layer 211, and the first gate spacer 121. Further, the second capping pattern 132 may be formed on the second gate electrode G22, the first insulating layer 211, and the second gate spacer 122. Further, the third capping pattern 133 may be formed on the third gate electrode G23, the first insulating layer 211, and the third gate spacer 123.

Referring back to FIG. 19, the etching stop layer 150 and the second interlayer insulating layer 160 may be sequentially formed on each of the first interlayer insulating layer 140 and the first, second and third capping patterns 131, 132 and 133 to substantially complete the manufacture of the semiconductor device of FIG. 19.

Hereinafter, various semiconductor devices according to embodiments of the inventive concept will be described in relation to the respective cross-sectional views of FIGS. 34, 35, 36, 37, 38 and 39, primarily in the context of material differences with the semiconductor device of FIG. 2.

Figure 34:
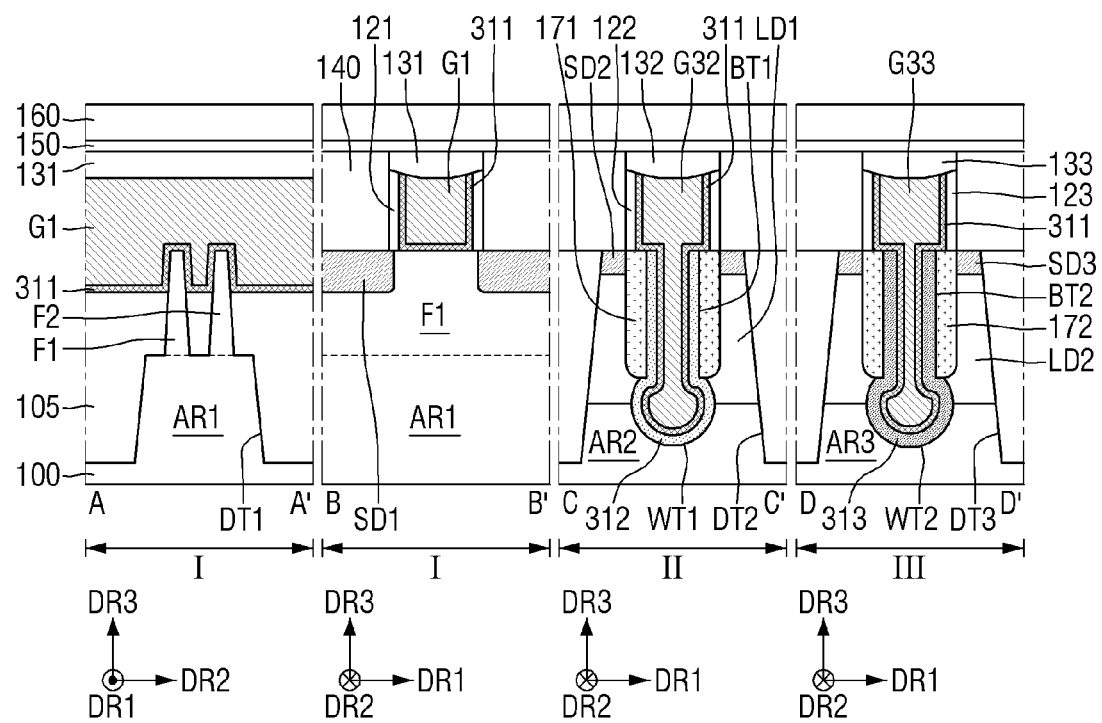
FIGS. 34, 35, 36, 37, 38, and 39 are respective cross-sectional views illustrating various semiconductor devices according to embodiments of the inventive concept.

Referring to FIG. 34, a second insulating layer 312 may vertically extend along the side walls of the first buried trench BT1. Further, the third insulating layer 313 may extend in the vertical direction DR3 along the side walls of the second buried trench BT2.

Specifically, the second insulating layer 312 may be disposed along each of the side walls of the first buried trench BT1, and the side walls and the bottom surface of the first wing trench WT1. Further, the third insulating layer 313 may be disposed along each of the side walls of the second buried trench BT2, and the side walls and the bottom surface of the second wing trench WT2. The second insulating layer 312 may contact the first buried insulating layer 171 within the first buried trench BT1. The third insulating layer 313 may contact the second buried insulating layer 172 within the second buried trench BT2.

The first insulating layer 311 may be disposed on the second insulating layer 312 within each of the first wing trench WT1 and the first buried trench BT1. Further, the first insulating layer 311 may be disposed on the third insulating layer 313 within each of the second wing trench WT2 and the second buried trench BT2. The second gate electrode G32 may be disposed on the first insulating layer 311 within each of the first wing trench WT1 and the first buried trench BT1. The third gate electrode G33 may be disposed on the first insulating layer 311 within each of the second wing trench WT2 and the second buried trench BT2.

Figure 35:
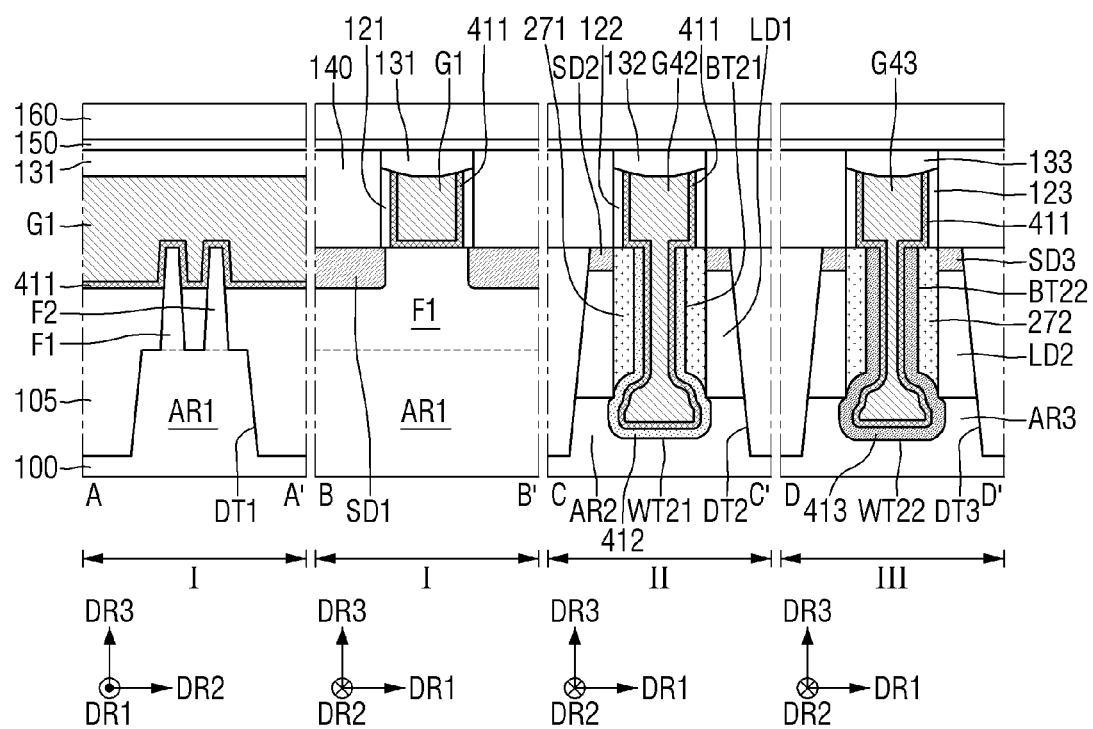

Referring to FIG. 35, a second insulating layer 412 may vertically extend along the side walls of the first buried trench BT21. Further, a third insulating layer 413 may extend in the vertical direction DR3 along the side walls of the second buried trench BT22.

Specifically, the second insulating layer 412 may be formed along each of the side walls of the first buried trench BT21, the side walls and the bottom surface of the first wing trench WT21, and the lower surface of the first buried insulating layer 271 exposed to the first wing trench WT21. Further, the third insulating layer 413 may be disposed along each of the side walls of the second buried trench BT42, the side walls and the bottom surface of the second wing trench WT42, and the lower surface of the second buried insulating layer 272 exposed to the second wing trench WT22. The second insulating layer 412 may contact the first buried insulating layer 271 within the first buried trench BT21. The third insulating layer 413 may contact the second buried insulating layer 272 within the second buried trench BT22.

The first insulating layer 411 may be disposed on the second insulating layer 412 within each of the first wing trench WT21 and the first buried trench BT21. Further, the first insulating layer 411 may be disposed on the third insulating layer 413 within each of the second wing trench WT22 and the second buried trench BT22. The second gate electrode G42 may be disposed on the first insulating layer 411 within each of the first wing trench WT21 and the first buried trench BT21. The third gate electrode G43 may be disposed on the first insulating layer 411 within each of the second wing trench WT22 and the second buried trench BT22.

Figure 36:
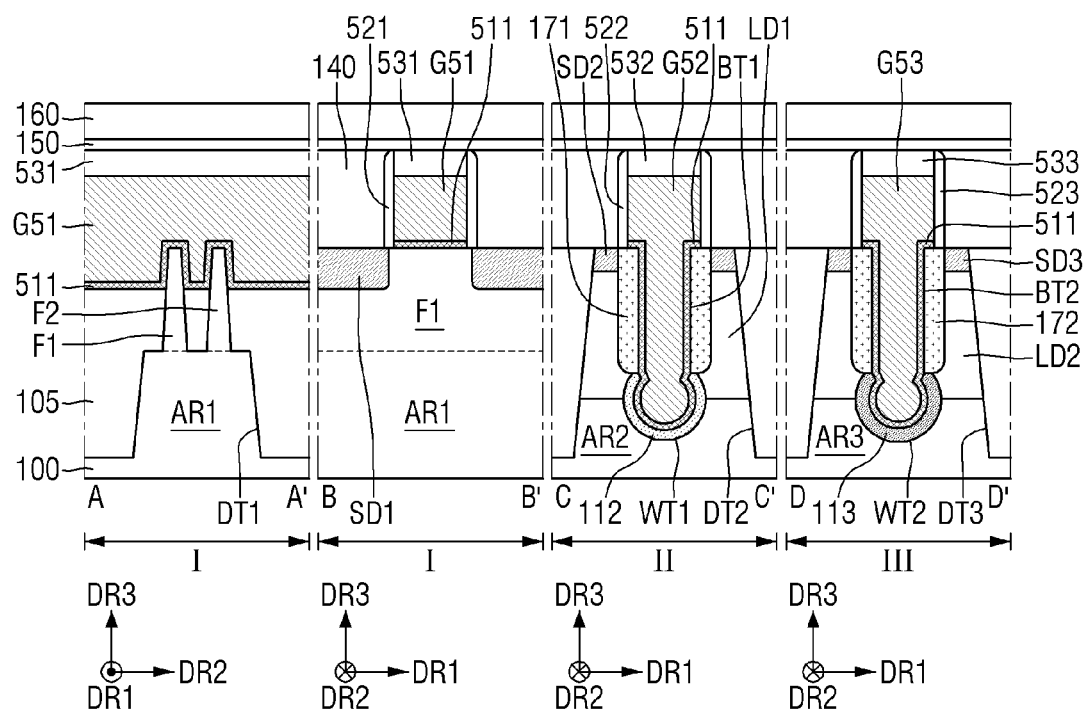

Referring to FIG. 36, a first insulating layer 511 and first to third gate electrodes G51, G52 and G53 may be formed using a patterning process.

Specifically, the first insulating layer 511 is not disposed between the first gate spacer 521 and the first gate electrode G51, between the second gate spacer 522 and the second gate electrode G52, and between the third gate spacer 523 and the third gate electrode G53. The first gate electrode G51 may contact the first gate spacer 521, the second gate electrode G52 may contact the first gate spacer 522, and the third gate electrode G53 may contact the third gate spacer 523.

A first capping pattern 531 may be disposed on the first gate electrode G51, a second capping pattern 532 may be disposed on the second gate electrode G52, and a third capping pattern 533 may be disposed on the third gate electrode G53. The first capping pattern 531 may be disposed between the first gate spacers 521, the second capping pattern 532 may be disposed between the second gate spacers 522, and the third capping pattern 533 may be disposed between the third gate spacers 523.

Figure 37:
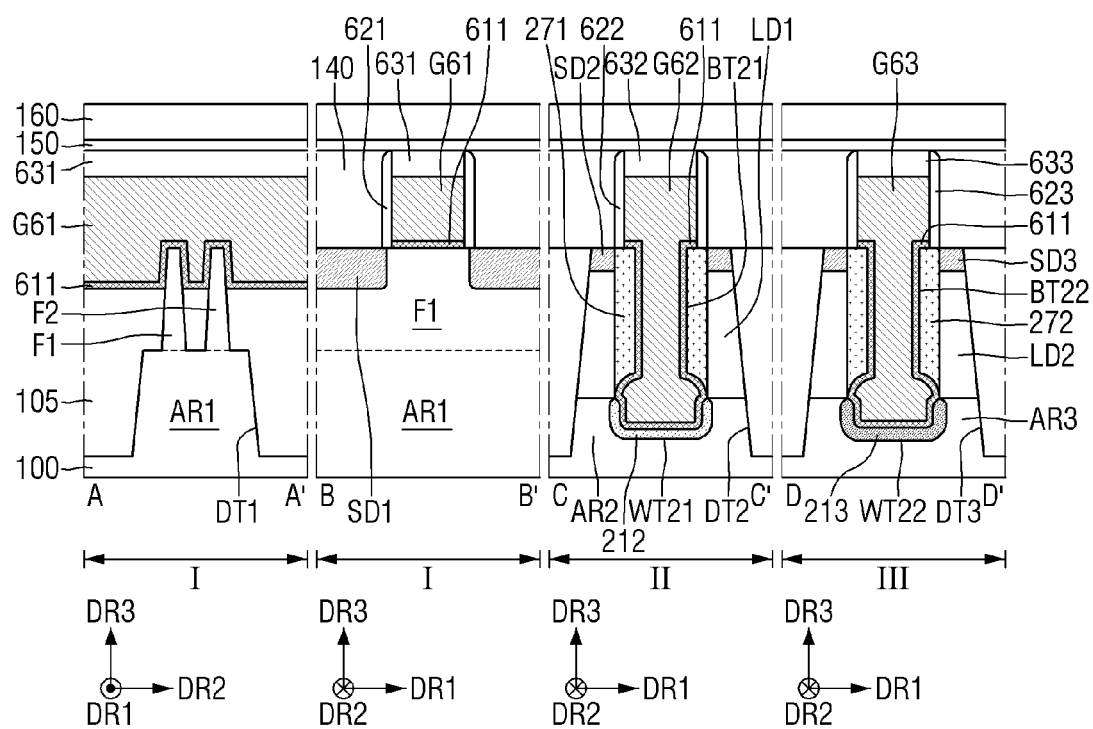

Referring to FIG. 37, a first insulating layer 611 and first to third gate electrodes G61, G62 and G63 may be formed by a patterning process.

Specifically, the first insulating layer 611 is not disposed between a first gate spacer 621 and a first gate electrode G61, between a second gate spacer 622 and a second gate electrode G62, and between a third gate spacer 623 and a third gate electrode G63. The first gate electrode G61 may contact the first gate spacer 621, the second gate electrode G62 may contact the second gate spacer 622, and the third gate electrode G63 may contact the third gate spacer 623.

A first capping pattern 631 may be disposed on the first gate electrode G61, a second capping pattern 632 may be disposed on the second gate electrode G62, and a third capping pattern 633 may be disposed on the third gate electrode G63. The first capping pattern 631 may be disposed between the first gate spacers 621, the second capping pattern 632 may be disposed between the second gate spacers 622, and the third capping pattern 633 may be disposed between the third gate spacers 623.

Figure 38:
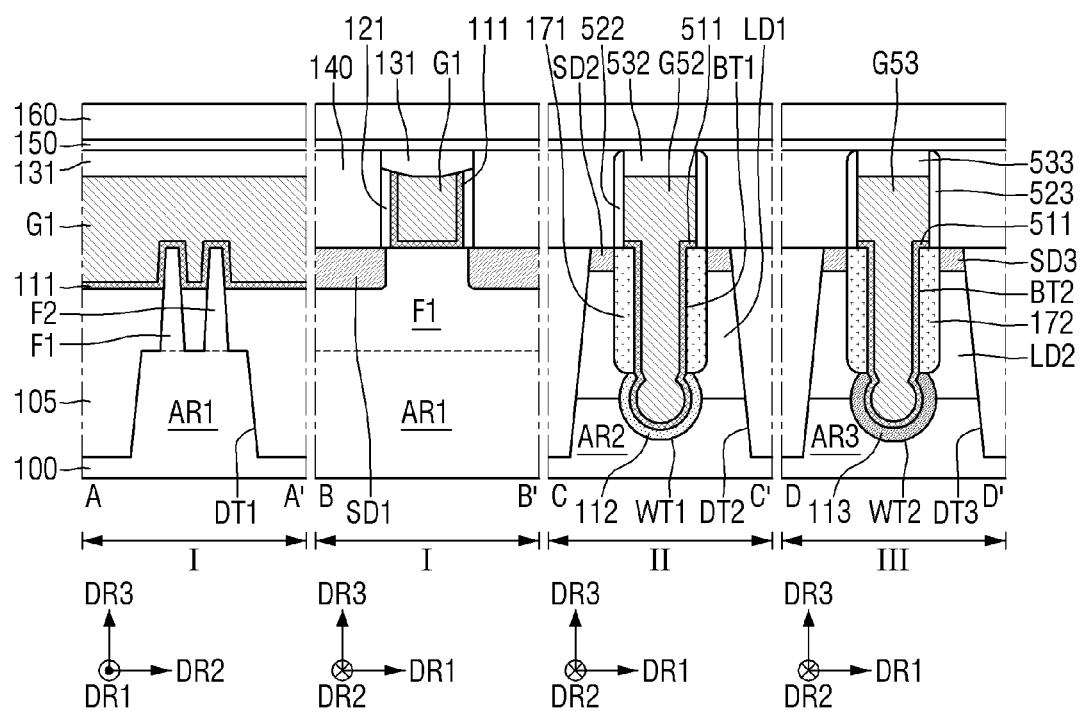

Referring to FIG. 38, the first insulating layer 111 and the first gate electrode G1 on the first region I may be formed using a redisposement metal gate (RMG) process. Further, the first insulating layer 511, the second gate electrode G52 and the third gate electrode G53 on each of the second and third regions II and III may be formed by a patterning process.

For example, a structure formed on the first region I of FIG. 38 may have the same structure as the structure formed on the first region I of FIG. 2. Structures formed on each of the second and third regions II and III of FIG. 38 may have substantially the same structure as the structures previously described in relation to the second and third regions II and III of FIG. 36.

Figure 39:
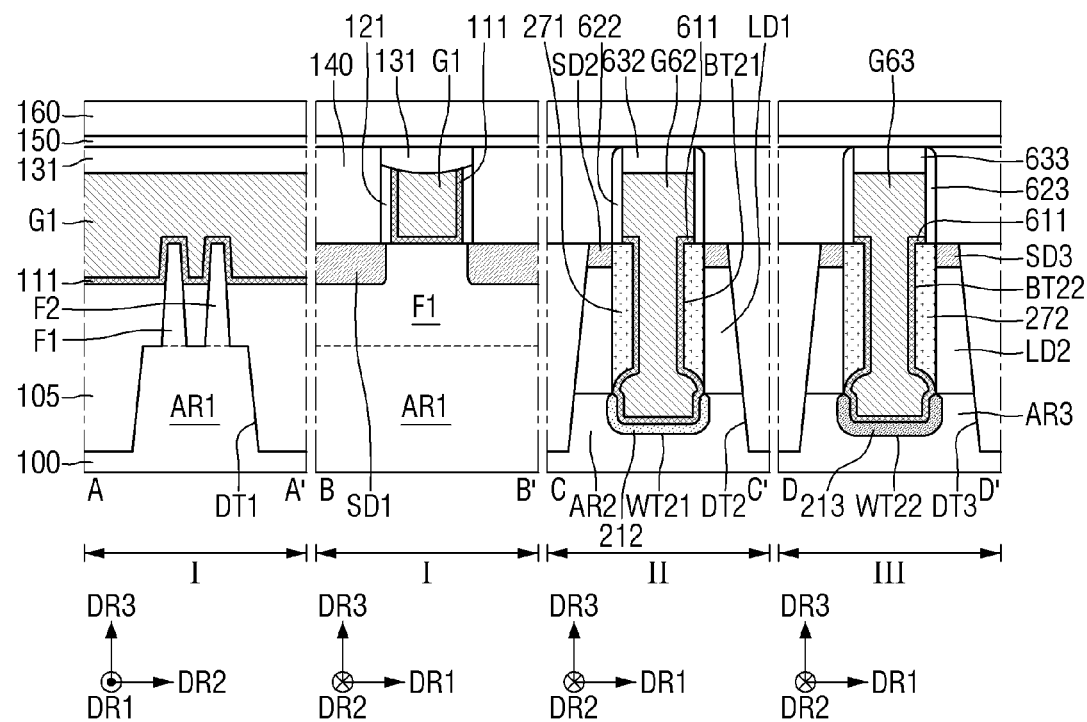

Referring to FIG. 39, the first insulating layer 111 and the first gate electrode G1 in the first region I may be formed using the redisposement metal gate (RMG) process. Further, the first insulating layer 611, the second gate electrode G62, and the third gate electrode G63 on each of the second and third regions II and III may be formed by the patterning process.

Here, the structure formed in the first region I of FIG. 39 may be substantially the same as those described in relation to the first region I of FIG. 2, and the structures formed in each of the second and third regions II and III of FIG. 39 may have substantially the same structure as those described in relation to the second and third regions II and III of FIG. 37.

From the foregoing, those skilled in the art will appreciate that many variations and modifications may be made to the illustrated embodiments without substantially departing from the scope of the inventive concept, as defined by the following claims.

What is claimed is:
1. A semiconductor device comprising:
an active region extending in a first horizontal direction on a substrate;
source/drain regions disposed on the active region;
a buried trench formed between the source/drain regions;

a buried insulating layer surrounding both side walls of the buried trench in the first horizontal direction between the source/drain regions;

a wing trench formed in a lower part of the buried trench and having a width greater than a width of the buried trench; and a gate electrode extending in a second horizontal direction on the active region, and disposed within each of the buried trench and the wing trench.

2. The semiconductor device of claim 1, further comprising:

a low doping region between the active region and the source/drain regions, and surrounding both side walls of the buried insulating layer in the first horizontal direction.

3. The semiconductor device of claim 2, wherein side walls of the wing trench overlap a boundary between the active region and the low doping region in the first horizontal direction.

4. The semiconductor device of claim 1, further comprising:

a gate insulating layer disposed along side walls and a bottom surface of the gate electrode, wherein the gate insulating layer includes a second insulating layer and a first insulating layer disposed on the second insulating layer.

5. The semiconductor device of claim 4, wherein the second insulating layer is disposed along side walls and a bottom surface of the wing trench, and contacts the active region, and the first insulating layer is disposed on the second insulating layer within the wing trench, extends in a vertical direction along the side walls of the buried trench, and contacts the buried insulating layer within the buried trench.

6. The semiconductor device of claim 4, wherein the second insulating layer is disposed along side walls of the buried trench, along side walls and a bottom surface of the wing trench, contacts the active region within the wing trench, and contacts the buried insulating layer within the buried trench, and the first insulating layer is disposed on the second insulating layer within each of the wing trench and the buried trench.

7. The semiconductor device of claim 1, wherein the width of the wing trench is less than a width between both outer walls of the buried insulating layer.

8. The semiconductor device of claim 1, wherein the width of the wing trench is greater than a width between both outer walls of the buried insulating layer.

9. The semiconductor device of claim 1, further comprising:

a gate spacer extending in the second horizontal direction along both side walls of the gate electrode on the buried insulating layer; and a gate insulating layer between the gate spacer and the gate electrode.

10. The semiconductor device of claim 1, further comprising:

a gate spacer extending in the second horizontal direction along both side walls of the gate electrode on the buried insulating layer and contacting the gate electrode.

11. A semiconductor device comprising:

a substrate including a first region and a second region;
a first active region extending in a first horizontal direction on the first region;

an active pattern protruding from the first active region in a vertical direction and extending in the first horizontal direction;

a second active region extending in the first horizontal direction on the second region;

first source/drain regions disposed on the active pattern;
second source/drain regions disposed on the second active region;

a buried trench formed between the second source/drain regions;

a wing trench formed in a lower part of the buried trench and having a width greater than a width of the buried trench;

a first gate electrode extending in a second horizontal direction on the active pattern; and a second gate electrode extending in the second horizontal direction on the second active region and disposed within each of the buried trench and the wing trench.

12. The semiconductor device of claim 11, further comprising:

a buried insulating layer surrounding both side walls of the buried trench in the first horizontal direction between the second source/drain regions; and a low doping region between the second active region and the second source/drain regions and surrounding both side walls of the buried insulating layer in the first horizontal direction.

13. The semiconductor device of claim 12, wherein the width of the wing trench is less than a width between both outer walls of the buried insulating layer.

14. The semiconductor device of claim 12, wherein the width of the wing trench is greater than the width between both outer walls of the buried insulating layer.

15. The semiconductor device of claim 11, further comprising:

a first gate insulating layer between the first gate electrode and the active pattern and including a first insulating layer; and a second gate insulating layer disposed along side walls and a bottom surface of the second gate electrode and including a second insulating layer, wherein the first insulating layer is disposed on the second insulating layer.

16. The semiconductor device of claim 15, wherein the second insulating layer is disposed along side walls and a bottom surface of the wing trench, the second insulating layer contacts the second active region, the first insulating layer is disposed in the second region,
the first insulating layer is disposed on the second insulating layer within the wing trench, and the first insulating layer is disposed in the second region and vertically extends along side walls of the buried trench.

17. A semiconductor device comprising:

a substrate including a first region, a second region and a third region;

a first active region extending in a first horizontal direction on the first region;

an active pattern protruding from the first active region in a vertical direction and extending in the first horizontal direction;

a second active region extending in the first horizontal direction on the second region;

a third active region extending in the first horizontal direction on the third region;

first source/drain regions disposed on the active pattern;

second source/drain regions disposed on the second active region;

third source/drain regions disposed on the third active region;

a first buried trench formed between the second source/drain regions;

a second buried trench formed between the third source/drain regions;

a first buried insulating layer surrounding both side walls of the first buried trench in the first horizontal direction between the second source/drain regions;

a second buried insulating layer surrounding both side walls of the second buried trench in the first horizontal direction between the third source/drain regions;

a first wing trench formed in a lower part of the first buried trench and having a width greater than a width of the first buried trench;

a second wing trench formed in a lower part of the second buried trench and having a width greater than a width of the second buried trench;

a first gate electrode extending in a second horizontal direction on the active pattern;

a second gate electrode extending in the second horizontal direction on the second active region and disposed within each of the first buried trench and the first wing trench; and a third gate electrode extending in the second horizontal direction on the third active region and disposed within each of the second buried trench and the second wing trench.

18. The semiconductor device of claim 17, further comprising:

a first low doping region disposed between the second active region and the second source/drain regions and surrounding both side walls of the first buried insulating layer in the first horizontal direction; and a second low doping region disposed between the third active region and the third source/drain regions and surrounding both side walls of the second buried insulating layer in the first horizontal direction, wherein side walls of the first wing trench overlap a boundary between the second active region and the first low doping region in the first horizontal direction, and side walls of the second wing trench overlap a boundary between the third active region and the second low doping region in the first horizontal direction.

19. The semiconductor device of claim 17, further comprising:

a first gate insulating layer disposed between the first gate electrode and the active pattern and including a first insulating layer;

a second gate insulating layer disposed along side walls and a bottom surface of the second gate electrode and including a second insulating layer; and a third gate insulating layer disposed along side walls and a bottom surface of the third gate electrode and including a third insulating layer, wherein the first insulating layer is disposed on the second insulating layer and on the third insulating layer, and a thickness of the third insulating layer is greater than a thickness of the second insulating layer.

20. The semiconductor device of claim 17, wherein the width of the second wing trench is greater than the width of the first wing trench.

* * * * *